US009087591B1

(12) United States Patent
Huang et al.

(10) Patent No.: US 9,087,591 B1
(45) Date of Patent: *Jul. 21, 2015

(54) METHOD AND APPARATUS FOR DETECTING VALID DATA USING SELECTIVE MODIFICATION OF CYCLIC REDUNDANCY CODES

(71) Applicant: Marvell International Ltd., Hamilton (BM)

(72) Inventors: ChengKuo Huang, Sunnyvale, CA (US); Siu-Hung Frederick Au, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/177,063

(22) Filed: Feb. 10, 2014

Related U.S. Application Data

(63) Continuation of application No. 13/722,840, filed on Dec. 20, 2012, now Pat. No. 8,656,231, which is a continuation of application No. 12/557,311, filed on Sep. 10, 2009, now Pat. No. 8,351,290.

(60) Provisional application No. 61/105,607, filed on Oct. 15, 2008, provisional application No. 61/096,522, filed on Sep. 12, 2008.

(51) Int. Cl.
*G11C 16/10* (2006.01)

(52) U.S. Cl.
CPC ...................................... *G11C 16/10* (2013.01)

(58) Field of Classification Search
None
See application file for complete search history.

(56) References Cited

U.S. PATENT DOCUMENTS

| | | | |
|---|---|---|---|
| 5,007,055 A | 4/1991 | Isono et al. | |
| 5,396,468 A | 3/1995 | Harari et al. | |
| 5,841,699 A | 11/1998 | Miyauchi | |
| 6,144,607 A | 11/2000 | Sassa | |
| 6,330,634 B1 | 12/2001 | Fuse et al. | |
| 6,377,491 B2 | 4/2002 | Otani et al. | |
| 6,426,893 B1 | 7/2002 | Conley et al. | |
| 7,231,577 B2 * | 6/2007 | Richardson et al. | 714/758 |
| 7,437,653 B2 | 10/2008 | Gorobets | |
| 7,613,256 B2 * | 11/2009 | van Veen et al. | 375/340 |
| 7,783,955 B2 * | 8/2010 | Murin | 714/763 |
| 7,949,929 B2 * | 5/2011 | Liang et al. | 714/769 |
| 7,969,806 B2 | 6/2011 | De Ambroggi et al. | |
| 7,984,360 B2 | 7/2011 | Sharon et al. | |
| 8,001,432 B2 | 8/2011 | Orbach et al. | |
| 8,145,977 B2 * | 3/2012 | Lee | 714/763 |
| 8,351,290 B1 | 1/2013 | Huang et al. | |
| 2004/0255225 A1 * | 12/2004 | Takai | 714/763 |
| 2006/0087893 A1 | 4/2006 | Nishihara et al. | |
| 2010/0070827 A1 | 3/2010 | Kim et al. | |

\* cited by examiner

*Primary Examiner* — Steve Nguyen

(57) ABSTRACT

A memory device and method, such as a flash memory device and method, includes a memory having a plurality of non-volatile memory cells for storing stored values of user data. The memory device and method includes a memory controller for controlling the memory. The memory controller includes an encoder for encoding user write data for storage of code values as the stored values in the memory. The encoder includes an inserter for insertion of an indicator as part of the stored values for use in determining when the stored values are or are not in an erased state. The memory controller includes a decoder for reading the stored values from the memory to form user read data values when the stored values are not in the erased state.

20 Claims, 9 Drawing Sheets

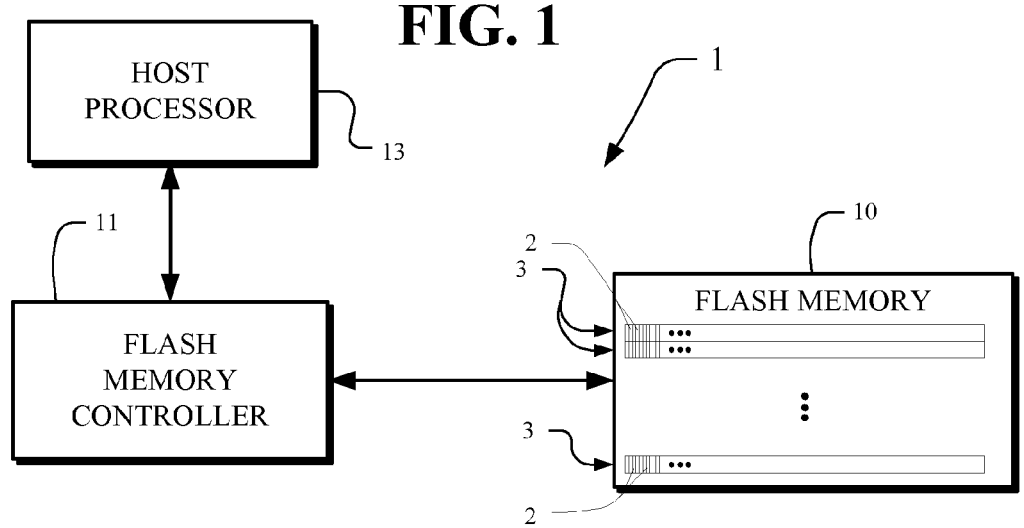
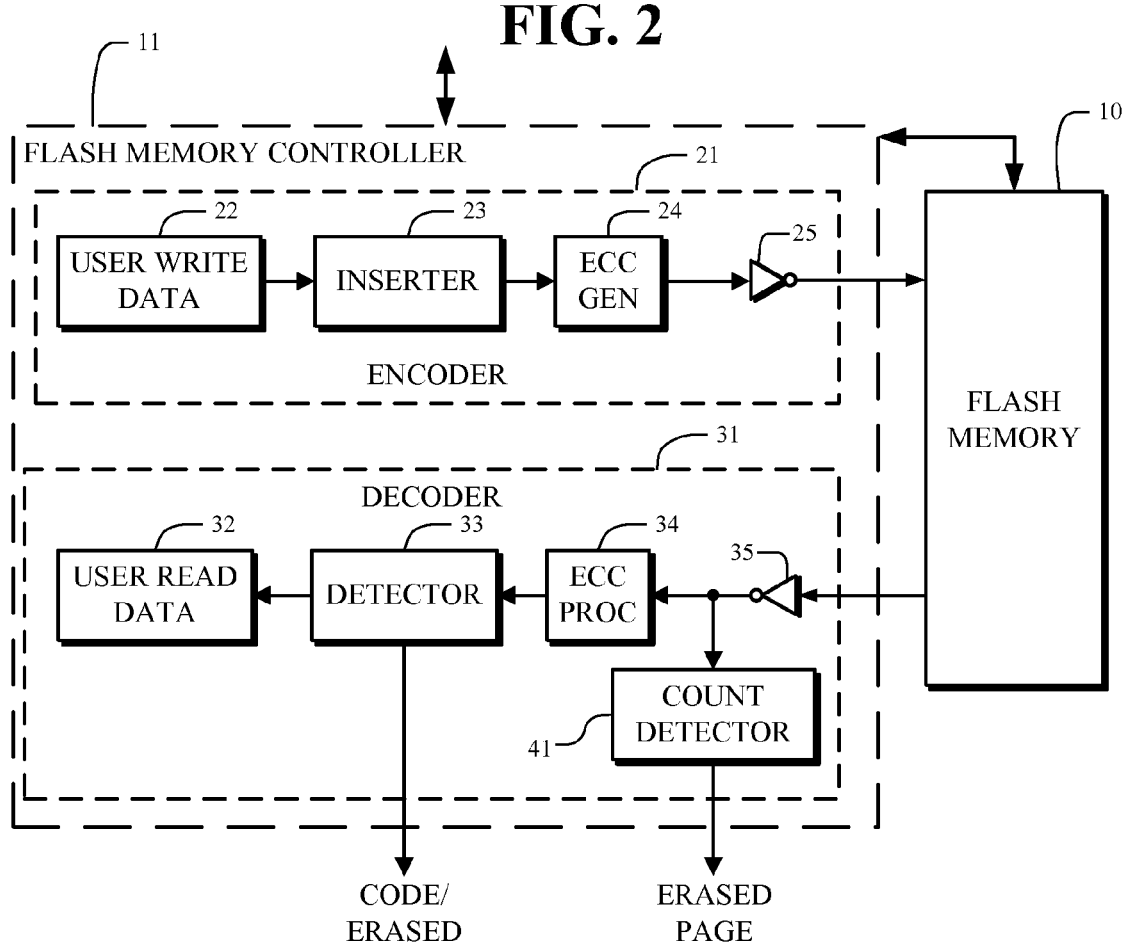

| BLK_1 | | ECC |
|---|---|---|
| BLK_2 | | ECC |
| BLK_3 | | ECC |
| BLK_4 | CRC | ECC |

METHOD AND APPARATUS FOR DETECTING VALID DATA USING SELECTIVE MODIFICATION OF CYCLIC REDUNDANCY CODES

CROSS-REFERENCED APPLICATIONS

The present disclosure is a continuation of and claims priority to U.S. patent application Ser. No. 13/722,840, filed Dec. 20, 2012, now U.S. Pat. No. 8,656,231, which claims priority to U.S. patent application Ser. No. 12/557,311, filed Sep. 10, 2009, now U.S. Pat. No. 8,351,290, issued Jan. 8, 2013, which claims priority to U.S. Provisional Patent Application No. 61/105,607, filed Oct. 15, 2008, and U.S. Provisional Patent Application No. 61/096,522, filed Sep. 12, 2008, which are incorporated herein by reference.

BACKGROUND OF THE INVENTION

This invention relates to memory devices and particularly to flash memory devices. Flash memory devices are provided as storage in personal digital assistants, laptop and other computers, digital audio players, digital cameras, mobile phones and other electronic devices.

Flash memory is a type of EEPROM (Electrically Erasable Programmable Read-Only Memory). EEPROM flash memories are formed by arrays of semiconductor memory cells. Each of the memory cells includes a floating gate field-effect transistor having electrically isolated gates (floating gates) capable of holding a charge. The data in a cell is determined by the presence or absence of the charge on the floating gate. Charges are transported to or removed from the floating gates by specialized programming and erase operations. Flash memory is non-volatile because no power is needed to maintain the charge on the floating gates and hence no power is needed to maintain the stored information. Write fatigue of floating gate memory cells can occur after repetitive writes and erasures so that the memory cells do not properly have the correct charges.

For reading and writing of data from and to a flash memory, the cells are accessed on a random access basis to change the charge or read the charge on the floating gates. For erasing data from a flash memory, cells are grouped into sections called "erase blocks". The charge is removed from the floating gates by block erase operations in which all floating gate memory cells in the erase block are erased in a single erase operation. In flash memory devices, a block can be written with new data only when the block is in the Erased State. Therefore, before a block can be written with new data, the block has to be erased to the Erased State. In the Erased State, all the bits in the block have the same logical state, typically a logical value of "1" so that the Erased State is an all 1's state.

A flash memory device contains multiple logically addressable pages. The logical addressable pages are usually correlated to the physical "erase block" sizes. In a typical example, an "erased block" has a size much larger than a page size. Commonly used flash devices have 4 KByte pages and 512 KByte erasable blocks. For example, pages that store between 512 bytes of data and 8 K bytes of data have between 512 8-bit cells and 8 K 8-bit cells.

In storage systems including flash memory devices, embedded operating systems (OS) manage the data stored in the flash memory devices and maintain records of which pages are in the Erased State. Only pages in the Erased State are available to store new data.

Under normal operating conditions, the operating system has full knowledge of which pages are erased pages. However, under some extraordinary conditions (for example, after power loss) the operating system's record of erased pages can be erroneous. When the erased pages record can be erroneous, the operating system goes through a detection procedure called Erased Page Detection to determine, if possible, which pages are in the Erased State.

There are difficulties presented by Erased Page Detection procedures. In flash memory systems, no indication is provided by the flash memory data as to whether or not any of the pages are in the Erased State. Erased Page Detection is done by reading the page data from a page in the flash memory. The 1's and 0's data content of the page is analyzed to determine if the content is all 1's. If all 1's, then the page may be in the Erased State. However, due to defects, frequently not all the bits are 1's when the page is in an Erased State. Also, when a page is not intended to be in an Erased State, the page nonetheless may be written with data so as to contain all 1's. Accordingly, it cannot always be determined conclusively whether a page is in the Erased State by merely analyzing the 1's and 0's data content of a page.

The ability to detect the erased or non-erased status of pages in flash memories is in part a function of the type of coding used to store data in the flash memory. In one example, BCH coding is used for flash memories.

BCH coding uses codes that are a class of parameterized, error-correcting codes which are easily decoded using syndrome decoding. Syndrome decoding is desirable since it is easily implemented with simple electronic hardware. As a class of codes, BCH codes are highly flexible and allow control over block length and acceptable error thresholds. Custom BCH codes can be easily designed according to well-known mathematical constraints. BCH codes have a code length, N, and have a correction power, T.

A page or block in flash memory is physically erased to one value, typically all 1's, and the all 1's are stored in the flash memory to represent erased values. However, it is not known whether such an all 1's sequence of values is or is not a code word. Similarly, the minimum distance from an all 1's erased sequence of values to the closest code word is not known. Under such conditions, conflicts can arise with certain types of code words to be stored as stored values in the flash memory. Codes, such as BCH codes, may have code values that conflict with the block erase states of flash memories.

Whenever the storage code values of any code words in flash memory are the same as the stored erased values in the flash memory, conflicts arise which need to be resolved. In one example, if all 0's code words are stored to flash memory with inversion to all 1's code values, then conflicts arise when the Erased State of flash memory is also all 1's values. In another example, if all 0's code words are stored to flash memory without inversion as all 0's code values, then conflicts arise when the Erased State of flash memory is also all 0's. In another example, if all 1's code words are stored to flash memory without inversion as all 1's code values, then conflicts arise when the Erased State of flash memory is also all 1's. In a still further example, if all 1's code words are stored to flash memory with inversion to all 0's code values, then conflicts arise when the Erased State of the flash memory is also all 0's. Still other conflicts between stored code values and stored erased values are possible.

It is desirable to be able to recognize in flash memory the erased or non-erased status of pages. In order to have efficient Erased Page Detection of erased pages in the flash memory that relies on the data content of the flash memory, an efficient flash memory controller is required. Efficient Erased Page Detection preferably requires no expansion or only a small expansion of the data page size and provides a large Hamming Distance between a user data page and an erased page in the flash memory.

In consideration of the above background, there is a need for improved flash memory devices that resolve conflicts between stored code words and stored erased states.

SUMMARY

A memory device and method, such as a flash memory device and method, includes a memory having a plurality of nonvolatile memory cells for storing stored values of user data. The memory device and method includes a memory controller for controlling the memory. The memory controller includes an encoder for encoding user write data for storage of code values as the stored values in the memory. The encoder includes an inserter for insertion of an indicator as part of the stored values for use in determining when the stored values are or are not in an erased state. The memory controller includes a decoder for reading the stored values from the memory to form user read data values when the stored values are not in the erased state.

In an embodiment of the memory device and method, the decoder includes a count detector for counting 1's in the stored values read from memory for indicating that the stored values are erased data if a number of 1's counted is less than a Threshold.

In an embodiment of the memory device and method, the code values have a correction power, T, and wherein the Threshold is equal to T.

In an embodiment of the memory device and method, the code values have a number of data bits, N, and wherein the Threshold is equal to N/2.

In an embodiment of the memory device and method, the decoder includes a detector for detecting the indicator in the stored values read from the memory.

In an embodiment of the memory device and method, the inserter includes a flag appender for appending a flag to the user data wherein the decoder includes a detector for detecting the flag in the user read data.

In an embodiment of the memory device and method, the flag is a 1-bit flag, a 2-bit flag, a 4-bit flag or an 8-bit flag.

In an embodiment of the memory device and method, the flag is a 2-bit flag wherein "10" and "01" states of the 2-bit flag represent a programmed page.

In an embodiment of the memory device and method, the encoder includes a cyclic redundancy code generator for generating a cyclic redundancy code, CRC, value and the inserter includes a converter for converting the CRC value to a converted CRC' value to indicate the presence of a code word. The decoder includes a CRC' detector for detecting the converted CRC' value to sense the presence of the code word and the decoder includes a CRC' to CRC converter for converting the CRC' value to the CRC value.

In an embodiment of the memory device and method, the encoder includes, user write data in a plurality of first blocks, an inverter for inverting the blocks to provide inverted second blocks, a 1's counter for counting the 1's for each first block to determine if each first block has more 1's than 0's, a selector for selecting first blocks or second blocks where the first block is selected when the first block does not have more 1's than 0's and the second block is selected if the first block has more 1's than 0's, a flag store for storing flags to indicate when second blocks are selected. The memory controller causes the flags, the selected first blocks and the selected second blocks to be written into and read from the memory as stored flags and stored blocks. The decoder includes a register for receiving each of the stored blocks as received blocks, an inverter for inverting the received blocks to form inverted stored blocks and a selector for selecting received blocks or inverted stored blocks where one of the received blocks is selected when a corresponding one of the flags is not set and one of the inverted stored blocks is selected when the corresponding one of the stored flags is set.

In an embodiment of the memory device and method, the encoder includes a conditional inverter for inverting user data to form inverted user data as a function of the number of 1's in the user data and for appending an identifying bit for indicating inversion. The user data or the inverted user data is stored in the memory as stored data. The decoder includes an erased page detector for detecting an erased page as a function of the number of 1's in the stored data.

In an embodiment of the memory device and method, in the encoder, the conditional converter includes a counter for counting the number of 1's in an input sector having a sector length of N to form a 1's count, a comparator for comparing the 1's count with N/2 to determine if the 1's count is greater than N/2, an inverter for inverting the sector if the 1's count is greater, an appender for appending a control bit as a 1 to signify inversion if the 1's count is greater and to append the control bit as a 0 if the 1's count is not greater, thereby forming a stored sector of N+1 bits. In the decoder, the erased page detector includes a counter for counting the number of 1's in the stored sector having a sector length of N+1 bits to determine a stored 1's count, a comparator for comparing the stored 1's count with N/2 to provide a conditional output if the stored 1's count is greater than N/2, an inverter for inverting the stored sector to form an inverted stored sector if the 1's count is not greater than N/2 and a remover for removing the control bit to provide an output sector of N bits formed of the inverted stored sector if the 1's count is not greater than N/2 and formed of the stored sector if the 1's count is greater than N/2.

The foregoing and other objects, features and advantages of the invention will be apparent from the following detailed description in conjunction with the drawings.

BRIEF DESCRIPTION OF THE DRAWINGS

FIG. 1 depicts a block diagram of a flash memory device having a flash memory controlled by a flash memory controller.

FIG. 2 depicts a block diagram of a flash memory device of FIG. 1 with further details of the flash memory controller.

DETAILED DESCRIPTION

Figure 3:
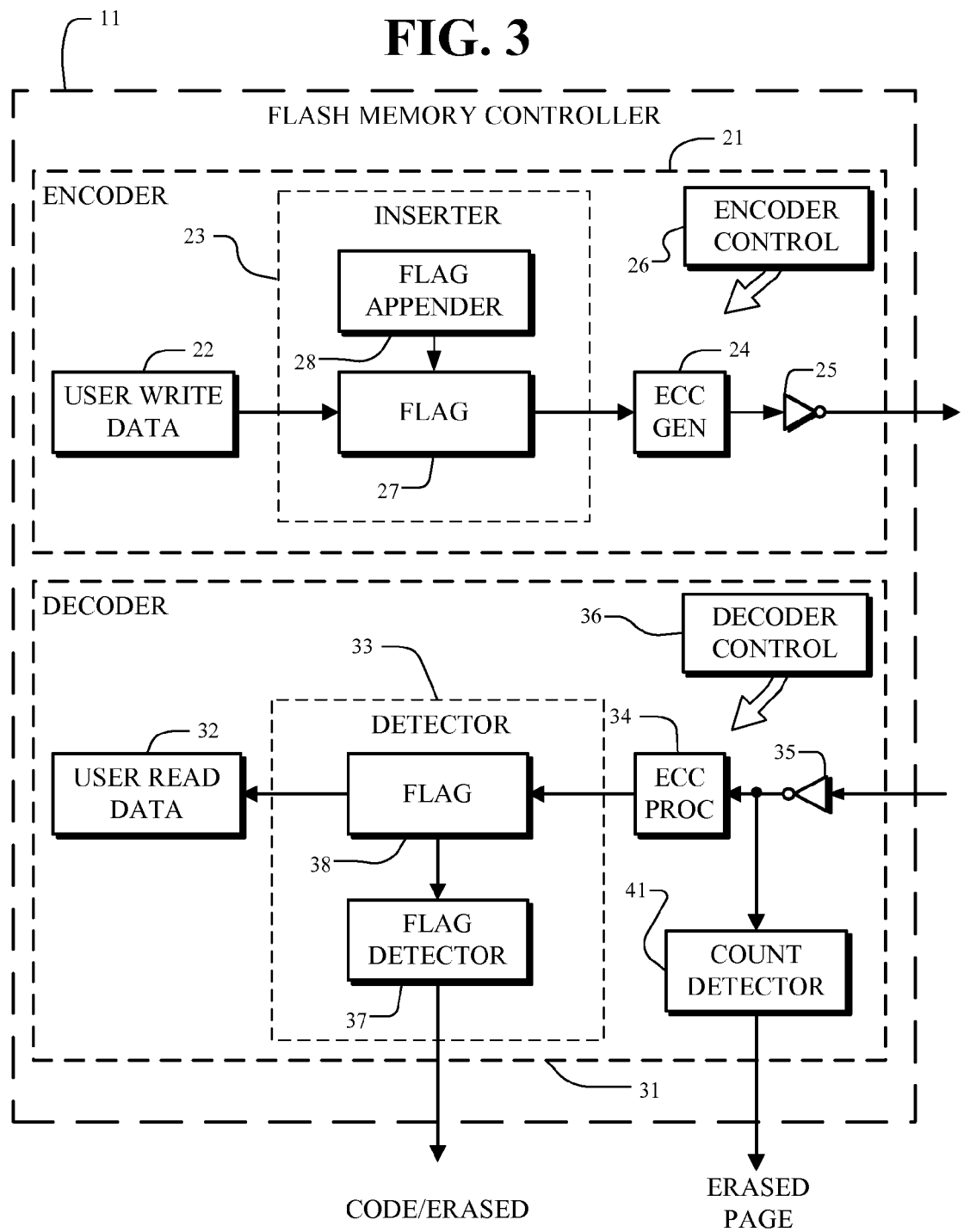
FIG. 3 depicts a block diagram of one embodiment of the flash memory controller of FIG. 2.

FIG. 1 depicts a block diagram of a flash memory device 1 having a flash memory 10 controlled by a flash memory controller 11 and a host processor 13. The flash memory 10 has a plurality of nonvolatile memory cells 2 organized in a plurality of erase blocks 3. All the cells 2 in any particular erase block 3 of the flash memory 10 are all erased at the same time in a single erase operation under control of the flash memory controller 11 and host processor 13. User data is written into and read from groups of the cells 2 in the flash memory 10 under control of the flash memory controller 11 and host processor 13.

FIG. 2 depicts a block diagram of further details of the flash memory controller 11 connected to the flash memory 10 of FIG. 1. The memory controller 11 controls the writing of user write data to and reading user read data from the flash memory 10.

The memory controller 11 includes an encoder 21 for encoding user write data in a register 22 for storage of code values as stored values in the memory 10. The encoder 21 includes an indicator inserter 23 for insertion of an indicator for indicating that one or more of the code values to be stored into the memory 10 is not an erased value. The encoder 21 includes an error correction code (ECC) generator 24 for generating an error correction code for the user write data in a register 22 and the indicator inserted by the inserter 23. In one typical example, the code value produced by encoder 21 is a BCH code where that BCH code value is inverted in inverter 25 to an inverted code value. The inverted code value is stored in the flash memory 10 as a stored value.

The memory controller 11 includes a decoder 31 for decoding the stored values from the memory 11 to form user read data values. The decoder 31 includes an inverter 35 for inverting the stored values read from the flash memory 10. The decoder 31 includes an ECC processor 34 for processing the inverted stored value from the flash memory 10. The decoder 31 includes an indicator detector 33 for detecting an indicator that indicates (CODE/ERASED) that the decoded value is either a valid code or an erased value.

The processor 1 of FIG. 1 commands the flash memory controller 11 of FIG. 2 to control the memory 10 to write code values in the memory 10 as stored values and to read stored values from the memory 10. The host processor 13 and flash memory controller 11 of FIG. 1 erase blocks in the memory 10 by storing erased values in the memory cells a block 3 of memory cells 2 at a time.

By way of back ground, a page or block in the memory 10 is physically erased to all 1's and the all 1's are the stored erased values in the memory 10. However, it is not known whether such an all 1's sequence of stored values is or is not a code word. Similarly, the minimum distance from an all 1's sequence to the closest code word is not known. With these background conditions for the flash memory 10, it is apparent that conflicts can arise with certain types of code words to be stored as stored values in memory 10.

In one example, BCH15 code words may have any length of all 0's (up to the code limit of $2^{15}$ 0's). In FIG. 2, with the inverter 25 in the channel from encoder 21 to the flash memory 10, any string of all 0's in a code word is inverted to a string of all 1's as the stored values in the memory 10. Since an erase operation also stores all 1's as the stored values, the erased string of all 1's cannot be distinguished from code word string of all 1's without further inserted information.

When the decoder 31 reads a string of all 1's, the all 1's are inverted in inverter 35 to all 0's. If a whole page or block in memory 10 has all 1's as the stored values, once inverted in inverter 35, the string becomes all 0's. If such operation were permitted without further inserted information, confusion would exist as to whether the all 0's represents a BCH code word or an erased condition.

In order to avoid the confusion, the FIG. 2 device operates to insure that an all 0's code word never is permitted and hence, after inversion in inverter 25 an all 1's string only is never stored as stored values for a code word.

The operations of the inserter 23 and the detector 33 ensure that a valid code word having the same stored values in the flash memory 10 can be distinguished from the erased state in the flash memory 10. In the example described, the all 0's code word is inverted in inverter 25 and becomes an all 1's code word which, absent the operation of the inserter 23, cannot be distinguished from the all 1's stored value of the erased state. The operation of the inserter 23, however, makes an insertion into or in addition to the all 1's code word (for example adds a 0) which later upon reading is detected by the detector 33. The insertion detected by the detector 33 detects that the all 1's erased value (having no insertion such as a 0) is different from the all 1's code word (having an insertion such as a 0).

The inverters 25 and 35 ensure that the all 0's codeword will always give rise to the all 1's erase values of an erased page (except as distinguished by the insertion of inserter 23). The distinction between code word and erased state is made irrespective of the parameters of the BCH code. The operation of the inverters 25 and 35 provides certainty that the erased page and the codeword (other than the insertion) have the same values. In the absence of the inverting, no decision can be made with certainty as to whether or not an erased page is a codeword because an all 1's string may or may not be a codeword depending on the parameter given to the BCH code.

In FIG. 2, count detector 41 determines, if the number of 1's in the stored values read from memory is less than a threshold, that the stored values are erased data. The count detector 41 counts the number of 1's in the data read from the flash memory 10 after inversion in the inverter 35. If the number of 1's is less than T, where T is a threshold equal to the correction power of the code, the read data from the flash memory 10 is determined to be erased data (ERASED DATA). If the number of 1's is greater than or equal to T, then the read data from the flash memory 10 is determined to be not erased data.

FIG. 3 depicts a block diagram of one embodiment of the flash memory controller 11 of FIG. 2. The memory controller 11 includes an encoder 21 for encoding user write data in a register 22 for storage of code values as stored values in the memory 10. The encoder 21 includes an indicator inserter 23 for insertion of an indicator for indicating that one or more of the code values to be stored into the memory 10 is not an erased value. In the FIG. 3 embodiment, indicator inserter 23 uses a flag appender 28 to append a flag to user write data in register 22. The encoder 21 includes an error correction code generator 34 for generating an error correction code for the user write data in a register 22 and the indicator inserted by the inserter 23. In one typical example, the code value produced by encoder 21 is a BCH code where that BCH code value is inverted in inverter 25 to an inverted code value. The inverted code value is stored in the flash memory 10 as a stored value.

The memory controller 11 includes a decoder 31 for decoding the stored values from the memory 11 to form user read data values. The decoder 31 includes an inverter 35 for inverting the stored values read from the flash memory 10. The decoder 31 includes an ECC processor 34 for processing the inverted stored values from the flash memory 10. The decoder 31 includes an indicator detector 33 for detecting an indicator that indicates that the decoded value is a valid code value and not an erased value. In FIG. 3, the indicator detector 33 includes a flag register 38 for receiving the flag from the ECC processor 34 and a flag detector 37 for detecting the state of the flag in register 38. The status of the flag indicates whether the user read data in register 32 is a valid code word.

In FIG. 3, count detector 41 determines, if the number of 1's in the stored values read from memory is less than a threshold, that the stored values are erased data. The count detector 41 counts the number of 1's in the data read from the flash memory 10 after inversion in the inverter 35. If the number of 1's is less than T, where T is a threshold equal to the correction power of the code, the read data from the flash memory 10 is determined to be erased data. If the number of 1's is greater than or equal to T, then the read data from the flash memory 10 is determined to be not erased data.

In order to avoid confusion, the flash memory 11 of FIG. 3 operates to insure that an all 0's code word is never permitted and hence, after inversion in inverter 25 an all 1's string is never stored as stored values for a code word. The indicator inserter 23 of FIG. 3 operates to insert a flag in flag register 27 whenever the user write data in register 22 is all 0's. The flag may be one or more bits and includes, for example, 1-bit, 2-bit, 4-bit and 8-bit (1-byte) embodiments.

In a 1-bit flag embodiment, the code word data appears as shown in the following TABLE 1:

TABLE 1

|  | USER DATA | USER DATA & FLAG | INVERTED & STORED DATA |
|---|---|---|---|
| ENCODE | 00000 . . . | 100000 . . . | 011111 . . . |
| DECODE | 00000 . . . | 100000 . . . | 011111 . . . |
| ERASE |  |  | 111111 . . . |
| DECODE |  | 000000 . . . | 111111 . . . |

In TABLE 1, the all 0's user data "00000 . . . " has a 1-bit flag appended so that the encoded user data and flag is "100000 . . . " which becomes inverted and forms the code word stored data as "011111 . . . ". Upon decoding, the code word stored data "011111 . . . " is inverted to the user data and flag as "100000 . . . ". The presence of the flag bit "1" indicates that the all 0's user data is a valid code word.

In TABLE 1, an erase causes the all 1's value "111111 . . . " to be stored as the stored value. Upon decoding of the all 1's stored value, the stored value "111111 . . . " is inverted to "00000 . . . ". When the "00000 . . . " value has the flag bit position examined, the "0" flag bit indicates that the remaining all 0's value is not a valid code word and hence corresponds to an erased block.

Using a 1-bit flag, the flash memory device 1 of FIG. 1 theoretically operates without errors to distinguish between stored values which are code words and stored values which are erased words and hence are not code words. However, flash memories frequently encounter errors in operation and hence an error analysis is warranted. Since the flash memory device 1 (see FIG. 1) employs error correction codes, many errors are corrected by the ECC processing. However, in some circumstances not all errors are corrected and hence a "miscorrection" occurs. The consequences of such miscorrection are that detection errors may result as follows. The detection errors may result when an erased page or block is miscorrected or when a program page or block (a block storing code words) is miscorrected.

In the case of a miscorrection of an erased block or page, if the errors after miscorrection do not fall on the flag bit, this block or page is still considered as an erased page and if the errors after miscorrection fall on the flag bit, the erased page is considered as a programmed page (a block or page having code words) by accident. An erased page that is considered as a programmed page is also called a "Miss".

In the serious case of a miscorrection of a programmed block or page, if the errors after miscorrection do not fall on the flag bit, this block or page is considered as a programmed page and is still considered a miscorrected page and if the error after miscorrection falls on the flag bit, this programmed page is considered as an erased page by accident. A programmed page considered as an erased page by accident is called a "False Alarm".

Errors can occur in any location in the flash memory 10. The general format of a block, page or other section of the flash memory 10 is shown in TABLE 2 as follows:

TABLE 2

| FLAG | USER DATA | PARITY |
|---|---|---|
| 1 | 10111000............ | 101....... |

In one embodiment, a 1-bit flag value is stored in the FLAG location and that flag is shown as a "1" in TABLE 2. The 1-bit flag is either a "1" or a "0" where a "1" represents a code word (or program page) for the user data and a "0" represents an erased word (or erased page).

Errors are indicated in the flash memory 10 by an "X" in the cell locations, as shown by way of one example in the following TABLE 3.

TABLE 3

| X | X | X | X | X |
|---|---|---|---|---|

Errors that occur after the decode processing are similarly shown with an "X" in the bit location as shown in one example in the following TABLE 4.

TABLE 4

| FLAG | USER DATA | PARITY |
|---|---|---|
| X | X  X X | X |

For error analysis, the following definitions are used:
e=Number Of Errors After Miscorrection
L=Total Bits In A Codeword
M=Detection Error Probability
$P_n$=Probability That A Code Word Is Miscorrected And Contains n Errors
MR=Miscorrection Rate
DER=Detection Error Rate For error analysis, the DER is interpreted to represent "Miss". The rate of "False Alarm" is hard to quantify since "False Alarm" is data content dependent. Further, using 1's count detection (provided by the count detector 41 of FIG. 3), it is likely that only codewords containing very few 1's will be misjudged to be erased pages. Only a codeword containing fewer 1's than the correction power of the codeword would be considered as derived from an erased page. Generally, the probability of a misjudged erased page is very small because most of data will not contain very few 1's.

With the above definitions and assumptions, the Detection Error Probability, M, is given as follows:

$$M = \frac{\binom{L-1}{e-1}}{\binom{L}{e}} = \frac{e}{L} \qquad \text{Eq. (1)}$$

Using the above definitions, the Detection Error Rate, DER, is given as follows:

$$MR = P_1 + P_2 + \ldots + P_L \qquad \text{Eq. (2)}$$

Using the above definitions, the Miscorrection Rate, MR, is given as follows:

$$DER = P_1 \times \frac{1}{L} + P_2 \times \frac{2}{L} + \cdots + P_L \times \frac{L}{L} \qquad \text{Eq. (3)}$$

Comparing Eq. (2) and Eq. (3) indicates that the Detection Error Rate is less than the Miscorrection Rate.

In a typical example using 2 K code words, there are 16384 bits (not counting the ECC part). The errors after miscorrection (e) are always close to the actual errors on the channel (c). Assuming the correction power is T, the following equation applies:

$$(c-T) \leq e \leq (c+T) \qquad \text{Eq. (4)}$$

Since there should not be a large number of errors on the channel compatible to codeword length, $e \ll L$. Assume for purposes of explanation that e is approximately 50 since c needs to be large enough to cause miscorrection and c should not be too large. Under such miscorrection conditions, the detection error rate is $50/16384 \approx 3 \times 10^{-4}$ so that the detection error rate is $10^{-3}$ which is approximately $10^{-4}$ better than the miscorrection rate.

In another embodiment, a 2-bit flag with identical bits is stored in the FLAG location of TABLE 2. The 2-bit flag (identical bits) represents the following conditions:
00=Erased page
01=Uncorrectable
10=Uncorrectable
11=Programmed page Using a 2-bit flag (identical bits) with the flag "11" indicating a code word is represented by TABLE 5.

TABLE 5

| FLAG | USER DATA | PARITY |
|---|---|---|
| 11 | 10111000............ | 101....... |

Using a 2-bit flag (identical bits) with the flag "11" of TABLE 5, the following TABLE 6 represents a condition where both flag bits are decoded with an error.

TABLE 6

| FLAG | USER DATA | PARITY |
|---|---|---|
| XX | X X | X |

For the 2-bit flag (identical bits) embodiment of TABLE 7, the Detection Error Probability, $M_2$, is given as follows:

$$M_2 = \frac{\binom{L-2}{e-2}}{\binom{L}{e}} = \frac{e(e-1)}{L(L-1)} \approx \frac{e^2}{L^2} \qquad \text{Eq. (5)}$$

Comparing Eq. (5) with Eq. (1) indicates that using a 2-bit flag (identical bits) is better in that the Detection Error Probability is deceased by a factor of approximately e/L. For a 2 K code word case, the total detection error rate goes down by about $3 \times 10^{-4}$ to about $9 \times 10^{-8}$.

One drawback to having flag bits always programmed to "0" to designate the erased condition is that this programming tends to shorten the life span of the cells storing 0's. To overcome this drawback, another embodiment uses two opposite bits as a set of flag bits where only one of these two bits is a "0" and the other is a '1' in the data stream. Accordingly, for any given operation only one of the two corresponding cells is programmed to '0'. With such operation, the probability that any one of the two flag cells will be programmed to '0' is 0.5 and this probability is the same as the general case probability for any cell.

The 2-bit flag (opposite bits) is represented in the following TABLE 7:

TABLE 7

|  |  | USER DATA | USER DATA & FLAG | INVERTED & STORED |
|---|---|---|---|---|
| PROGRAM "10" | ENCODE | 00000... | 1000000... | 0111111... |
|  | DECODE | 00000... | 1000000... | 0111111... |
| PROGRAM "01" | ENCODE | 00000... | 0100000... | 1011111... |
|  | DECODE | 00000... | 010000... | 1011111... |
| ERASE "00" | ERASE |  |  | 111111... |
|  | DECODE |  | 0000000... | 111111... |
| MIS- |  |  |  | ??????... |
| CORRECTION "11" | DECODE |  | 1100000... | ??????... |

As indicated in TABLE 7 in the PROGRAM "10" case, the encoding and decoding of a 2-bit flag with "10" (which after inversion has a stored value of "01" in the memory) to represent a programmed code word is readily distinguished from the ERASE case where an all 1's erased word is decoded as "00" in the flag field. Similarly, as indicated in TABLE 7 in the PROGRAM "01" case, the encoding and decoding of a 2-bit flag with "01" (which after inversion has a stored value of "10") to represent a programmed code word is readily distinguished from the ERASE case where an all 1's erased word is decoded as "00" in the flag field.

As indicated in TABLE 7 in the MISCORRECTION case, any decoding of "11" in the flag field is a miscorrection. To decrease the miscorrection rate, the decoding of "11" is defined as an uncorrectable condition.

In the embodiment with a 2-bit flag (opposite bits) stored in the FLAG location of TABLE 2, the 2-bit flag (opposite bits) represents the following conditions:
00=Erased page
01=Programmed page
10=Programmed page
11=Uncorrectable Using a 2-bit flag (opposite bits) with the flag "00" indicating an erased page is represented by TABLE 8.

TABLE 8

| FLAG | USER DATA | PARITY |
|---|---|---|
| 0    0 | 10111000............ | 101....... |

Using a 2-bit flag (opposite bits) with the flag "00" of TABLE 8, the following TABLE 9 represents conditions where the flag bits are decoded with errors.

TABLE 9

| | FLAG | | USER DATA | | | PARITY | |
|---|---|---|---|---|---|---|---|
| Miss | X | | X | X | X | X | |
| Miss | | X | X | X | X | X | X |

In the 2-bit flag (opposite bits) embodiment of TABLE 9, the Detection Error Probability, $M_3$, is given as follows:

$$M_3 = \frac{\binom{L-2}{e-1}+\binom{L-2}{e-1}}{\binom{L}{e}} = \frac{2 \cdot e(L-e)}{L(L-1)} \approx 2 \cdot \frac{e}{L} \text{ (where } e \ll L\text{)} \quad \text{Eq. (6)}$$

One drawback of the 2-bit flag embodiments is that two cells are required for a flag pair, but these two cells contain only one bit of information. Also, as observed by comparing Eq. (6) with Eq. (1) the Detection Error Rate is doubled to be 2e/L while the Detection Error Rate (miss) stays at e/L. However, this drawback can be justified since it doubles the cell life span of the cells storing flag bits.

Using a 2-bit flag (opposite bits) with the flag "01" indicating a programmed (code word) page is represented by TABLE 10.

TABLE 10

| FLAG | USER DATA | PARITY |
|---|---|---|
| 1    0 | 10111000............ | 101....... |

Using a 2-bit flag (opposite bits) with the flag "10" of TABLE 10, the following TABLE 11 represents conditions where a flag bit is decoded with error.

TABLE 11

| | FLAG | USER DATA | | PARITY | |
|---|---|---|---|---|---|
| False Alarm | X | X | X | X | X |

In the 2-bit flag (opposite bits) embodiment of TABLE 11, the Detection Error Probability, $M_4$, is given as follows:

$$M_4 = \frac{\binom{L-2}{e-1}}{\binom{L}{e}} = \frac{e(L-e)}{L(L-1)} \approx \frac{e}{L} \text{ (where } e \ll L\text{)} \quad \text{Eq. (7)}$$

As observed by comparing Eq. (7) with Eq. (1) the Detection Error Rate remains about the same in a 2-bit flag (opposite bits) embodiment as in a 1-bit flag embodiment.

In another embodiment, four flag pairs form an 8-bit flag where the 8-bit flag is stored in the FLAG location of TABLE 2. The 8-bit flag, using opposite bits in each pair for a programmed page, represents the following conditions:
00000000=Erased page
01010101=Programmed page
10101010=Programmed page
All others=Uncorrectable Using an 8-bit flag, the flag is "00000000" for indicating an erased page as depicted in TABLE 12.

TABLE 12

| FLAG | USER DATA | PARITY |
|---|---|---|
| 0  0  0  0  0  0  0  0 | 10111000... | 101... |

Using an 8-bit flag "00000000" of TABLE 12 detection for miss conditions are depicted in the following TABLE 13 when the flag is decoded with errors.

TABLE 13

| | FLAG | | | | USER DATA | | | |
|---|---|---|---|---|---|---|---|---|
| Miss | X | X | X | X | X | X | X | X |
| Miss | | X | X | X | X | X | X | X | X |

In the 8-bit flag embodiment of TABLE 12, the Detection Error Probability, $M_5$, for a miss is given as follows in Eq. (8):

$$M_5 = \frac{\binom{L-8}{e-4}+\binom{L-8}{e-4}}{\binom{L}{e}} =$$

$$\frac{2 \cdot e(e-1)(e-2)(e-3)(L-e)(L-e-1)(L-e-2)(L-e-3)}{L(L-1)(L-2)(L-3)(L-4)(L-5)(L-6)(L-7)} \approx 2 \cdot \frac{e^4}{L^4}$$

where $e \ll L$ where e<<L
Eq. (8)

As is evident from Eq. (8), the detection error rate (miss) for an 8-bit flag is four times deeper than using only a 2-bit flag.

Using an 8-bit flag (with opposite bits in each pair), the flag is "10101010" for indicating a programmed page is as depicted in TABLE 13.

TABLE 13

| FLAG |   |   |   |   |   |   |   | USER DATA | PARITY |
|---|---|---|---|---|---|---|---|---|---|
| 1 | 0 | 1 | 0 | 1 | 0 | 1 | 0 | 10111000... | 101... |

Using an 8-bit flag (with opposite bits in each pair), flag "10101010" of TABLE 13 is depicted in the following TABLE 14 where the flag is decoded with errors for a false alarm.

TABLE 14

| FLAG | | | | | | | | USER DATA |
|---|---|---|---|---|---|---|---|---|
| False Alarm | X | X | X | X | X | X | X | X |

In the 8-bit flag (opposite bits) embodiment of TABLE 13, the Detection Error Probability, $M_6$, for a false alarm is given as follows in Eq. (9):

$$M_6 = \frac{\binom{L-8}{e-4}}{\binom{L}{e}} = \frac{e(e-1)(e-2)(e-3)(L-e)(L-e-1)(L-e-2)(L-e-3)}{L(L-1)(L-2)(L-3)(L-4)(L-5)(L-6)(L-7)} \approx \frac{e^4}{L^4} \text{ where } e << L \quad \text{Eq. (9)}$$

where e<<L

As is evident from Eq. (9), the detection error rate for an 8-bit flag is four times deeper than using only a 2-bit flag.

Assuming by way of example that a 2 K code word has $e/L \approx 10^{-4}$, using 4 flag pairs provides a detection error rate of approximately $10^{-16}$ under a miscorrection condition. Assuming that the miscorrection rate is approximately $10^{-40}$, the detection error rate is approximately $10^{-56}$ with an 8-bit (1-byte) flag.

Figure 4:
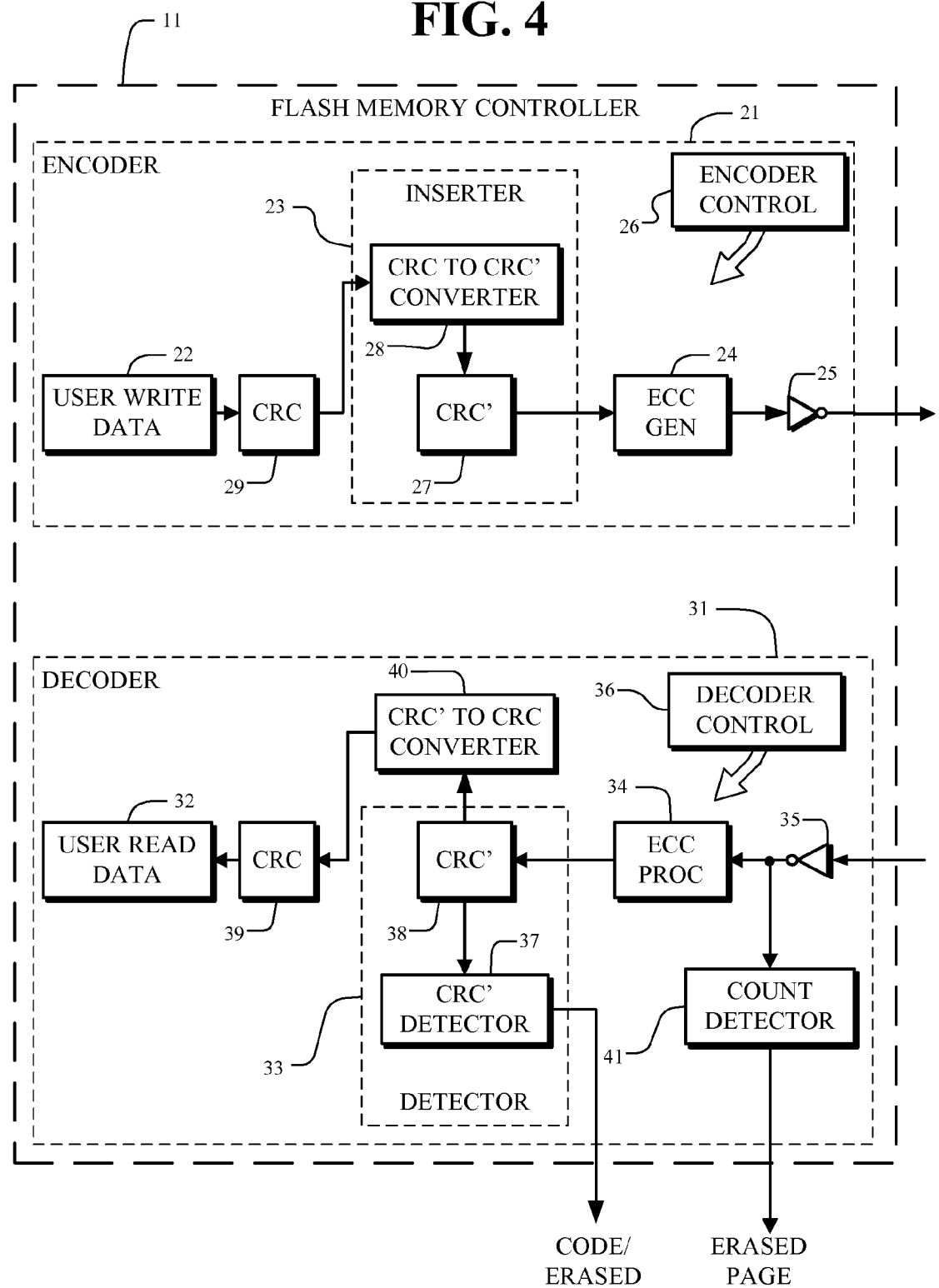
FIG. 4 depicts a block diagram of another embodiment of the flash memory controller of FIG. 2.

FIG. 4 depicts a block diagram of another embodiment of the flash memory controller 11 of FIG. 1 and FIG. 2. The memory controller 11 operates for controlling writing user write data to and reading user read data from the flash memory 10 of FIG. 1 and FIG. 2.

In FIG. 4, the memory controller 11 includes an encoder 21 for encoding user write data in a register 22 for storage of code values as stored values in the memory 10 of FIG. 1 and FIG. 2. The encoder 21 includes a CRC (cyclic redundancy code) generator 29 for generating a cyclic redundancy code value (CRC value) based upon the user read data in register 22. The encoder 21 includes an indicator inserter 23 for insertion of an indicator for indicating that one or more of the code values to be stored into the memory 10 are not erased values. In the FIG. 4 embodiment, the indicator inserter 23 complements or otherwise processes the CRC value from the CRC generator 29 to form the insertion. The encoder 21 includes an error correction code generator 34 for generating an error correction code for the user write data in a register 22 and the CRC' indicator inserted by the inserter 23.

In one typical example, the code value produced by encoder 21 is a BCH code where the BCH code value is inverted in inverter 25 to an inverted code value. The inverted code value is stored in the flash memory 10 of FIG. 1 and FIG. 2 as a stored value.

The memory controller 11 includes a decoder 31 for decoding the stored values from the memory 11 to form user read data values. The decoder 31 includes an inverter 35 for inverting the stored values read from the flash memory 10 of FIG. 1 and FIG. 2. The decoder 31 includes an ECC processor 34 for processing the inverted stored value from the flash memory 10. The decoder 31 includes an indicator detector 33 for detecting an indicator that indicates that the decoded value is a valid code value and not an erased value. In FIG. 4, indicator detector 33 includes the CRC' register 38 receiving the CRC' value from the inverter 35. The indicator detector 33 also includes a CRC' detector which in the FIG. 4 embodiment detects an all 1's condition of the CRC' value. If an all 1's condition is detected, it indicates that user read data in the register 32 is a code word. The CRC' TO CRC converter complements the CRC' value to form the CRC value loaded into register 39.

The processor 1 of FIG. 1 commands the flash memory controller 11 of FIG. 4 to control the memory 10 of FIG. 1 and FIG. 2 to write code values into the memory 10 as stored values and to read stored values from the memory 10. The processor 1 of FIG. 1 erases blocks in the memory 10 by storing erased values in the memory cells a block of memory cells at a time.

In connection with the operation of FIG. 4, a page or block in the memory 10 is physically erased to all 1's. In one example, BCH15 code words may have any length of all 0's (up to the code limit of $2^{15}$ 0's). In FIG. 4, with the inverter 25 in the channel from encoder 21 to the flash memory 10, any string of all 0's in a code word is inverted to a string of all 1's as the stored value in the memory 10. Since an erase operation also stores all 1's as the stored values, the erased string of all 1's alone cannot be distinguished from code word string of all 1's. However, any string of all 0's for the CRC value is complemented to all 1's as the CRC' value and will be inverted by inverter 25 to all 0's which are the stored values in the memory 10.

When the decoder 31 reads a string of all 1's representing a string of all 0's for user data, the corresponding CRC' value will be all 1's. The all 1's for the CRC' are detected by the CRC' detector to indicate the status as being a code word.

In connection with FIG. 4, an all 0's code word with an all 0's CRC is depicted in TABLE 15.

TABLE 15

| USER DATA | CRC | PARITY |
|---|---|---|
| 00000000... | 0000... | 0000... |

In connection with FIG. 4, an all 0's code word with an all 0's CRC will have the all 0's CRC complemented as depicted in TABLE 16.

TABLE 16

| USER DATA | CRC' | PARITY |
|---|---|---|
| 00000000... | 1111... | 00101... |

The TABLE 16 similarly represents the values in the receiver 31 after inversion by the inverter 35. By way of distinction, an all 1's erased value after inversion in inverter 35 appears as shown in the following TABLE 17.

TABLE 17

| USER DATA | CRC' | PARITY |
|---|---|---|
| 00000000... | 0000... | 00000... |

The CRC' value "1111 . . . " of TABLE 16 is readily distinguished from the CRC' value "0000 . . . " of TABLE 17.

Using an inverted 32-bit CRC, the miscorrection rate (MR) is reduced by $2^{-32}$. Therefore, the "Miss" rate is reduced to $(MR)(2^{-32})$. Although a "Miss" rate of $(MR)(2^{-32})$ is not as good as in previous examples, no additional facilities are required in addition to the CRC facility. If the memory device already uses CRC, then the additions for inversion of the CRC are minimal.

In FIG. 4, count detector 41 determines, if the number of 1's in the stored values read from memory is less than a threshold, that the stored values are erased data. The count detector 41 counts the number of 1's in the data read from the flash memory 10 after inversion in the inverter 35. If the number of 1's is less than T, where T is a threshold equal to the correction power of the code, the read data from the flash memory 10 is determined to be erased data. If the number of 1's is greater than or equal to T, then the read data from the flash memory 10 is determined to be not erased data.

Figure 5:
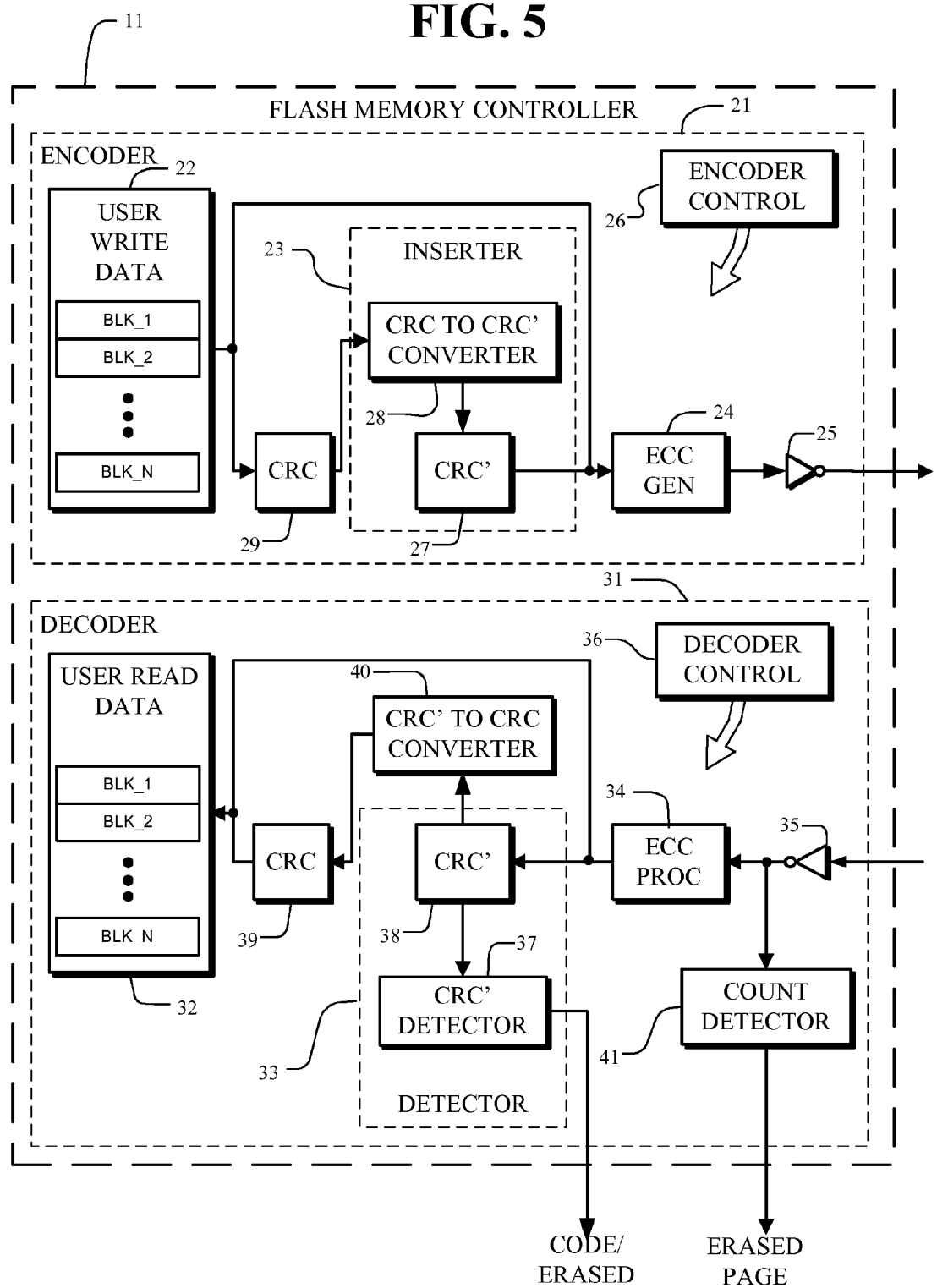
FIG. 5 depicts a block diagram of still another embodiment of the flash memory controller of FIG. 2.

FIG. 5 depicts a block diagram of still another embodiment of the flash memory controller 11 of FIG. 1 and FIG. 2. The memory controller 11 operates for controlling writing user write data to and reading user read data from the flash memory 10 of FIG. 1 and FIG. 2.

In FIG. 5, the memory controller 11 includes an encoder 21 for encoding user write data in a register 22 for storage of code values as stored values in the memory 10 of FIG. 1 and FIG. 2. The encoder 21 includes user write data registers 22 for storing blocks of write data, including blocks BLK_1, BLK_2, . . . , BLK_N. The encoder 21 includes a CRC (cyclic redundancy code) generator 29 for generating a CRC value based upon the user read data in all the registers 22 including all of the blocks BLK_1, BLK_2, . . . , BLK_N. The encoder 21 includes an indicator inserter 23 for insertion of an indicator for indicating that one or more of the code values to be stored into the memory 10 are not erased values. In the FIG. 5 embodiment, the indicator inserter 23 complements or otherwise processes the CRC value from the CRC generator 29 to form the CRC' value. The encoder 21 includes an error correction code generator 34 for generating an error correction code for the user write data in a register 22 and the CRC' indicator inserted by the inserter 23.

In one typical example, the code value produced by encoder 21 is a BCH code where the BCH code value is inverted in inverter 25 to an inverted code value. The inverted code value is stored in the flash memory 10 of FIG. 1 and FIG. 2 as a stored value.

The memory controller 11 includes a decoder 31 for decoding the stored values from the memory 11 to form user read data values. The decoder 31 includes an inverter 35 for inverting the stored values read from the flash memory 10 of FIG. 1 and FIG. 2. The decoder 31 includes an ECC processor 34 for processing the inverted stored values from the flash memory 10. The decoder 31 includes an indicator detector 33 for detecting an indicator that indicates that the decoded value is a valid code value and not an erased value. In FIG. 5, indicator detector 33 includes the CRC' register 38 receiving the CRC' value from the inverter 35. The indicator detector 33 also includes a CRC' detector which in the FIG. 5 embodiment detects for an all 1's condition of the CRC' value. If an all 1's condition is detected, it indicates that user read data in the registers 32 for each of the blocks BLK_1, BLK_2, . . . , BLK_N is a code word. The CRC' TO CRC converter 28 complements the CRC' value to form the CRC value loaded into register 39.

The processor 1 of FIG. 1 commands the flash memory controller 11 of FIG. 5 to control the memory 10 of FIG. 1 and FIG. 2 to write code values into the memory 10 as stored values and to read stored values from the memory 10. The processor 1 and controller 11 of FIG. 1 erase blocks in the memory 10 to all 1's by storing erased values in the memory cells a block of memory cells at a time.

In connection with the operation of FIG. 5, a page or block in the memory 10 is physically erased to all 1's. In one example, BCH15 code words may have any length of all 0's (up to the code limit of $2^{15}$ 0's). In FIG. 5, with the inverter 25 in the channel from encoder 21 to the flash memory 10, any string of all 0's in a code word, if not otherwise processed, would invert to a string of all 1's as the stored value in the memory 10. Since an erase operation also stores all 1's as the stored values, the erased string of all 1's alone cannot be distinguished from code word string of all 1's. In connection with the FIG. 5 embodiment, however, any string of all 0's for the CRC value is complemented to all 1's as the CRC' value and is inverted by inverter 25 to all 0's which are the stored values in the memory 10.

When the decoder 31 reads a string of all 1's representing a string of all 0's for user data in all the blocks BLK_1, BLK_2, . . . , BLK_N, the corresponding CRC' value is all 1's. The all 1's for the CRC' are detected by the CRC' detector to indicate the status as being a code word.

In FIG. 5, count detector 41 determines, if the number of 1's in the stored values read from memory is less than a threshold, that the stored values are erased data. The count detector 41 counts the number of 1's in the data read from the flash memory 10 after inversion in the inverter 35. If the number of 1's is less than T, where T is a threshold equal to the correction power of the code, the read data from the flash memory 10 is determined to be erased data. If the number of 1's is greater than or equal to T, then the read data from the flash memory 10 is determined to be not erased data.

Figures 6, 7:
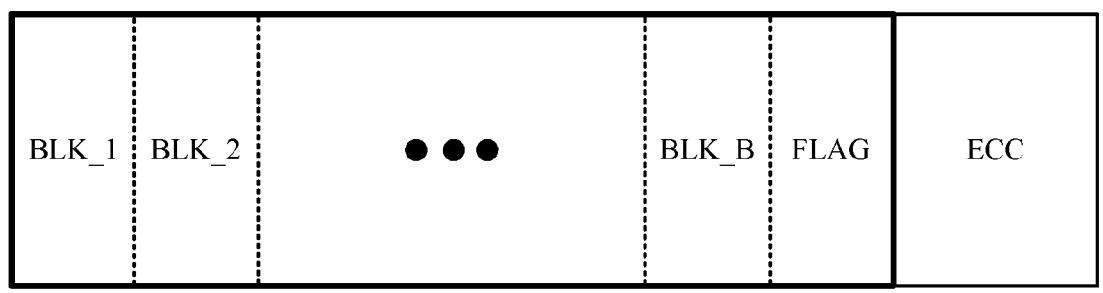
FIG. 6 depicts a block diagram of a data representation of the data in the flash memory controller of FIG. 5.
FIG. 7 depicts a block diagram of another data representation of the flash memory controller of FIG. 5.

FIG. 6 depicts a block diagram of a one data representation of the data in the flash memory controller of FIG. 5. In FIG. 6, there are four blocks so that the value of "N" in FIG. 5 is 4.

FIG. 7 depicts a block diagram of another data representation of the flash memory controller of FIG. 5. The data is organized in blocks BLK_1, BLK_2, . . . , BLK_B and has a flag and has ECC values.

Figure 8:
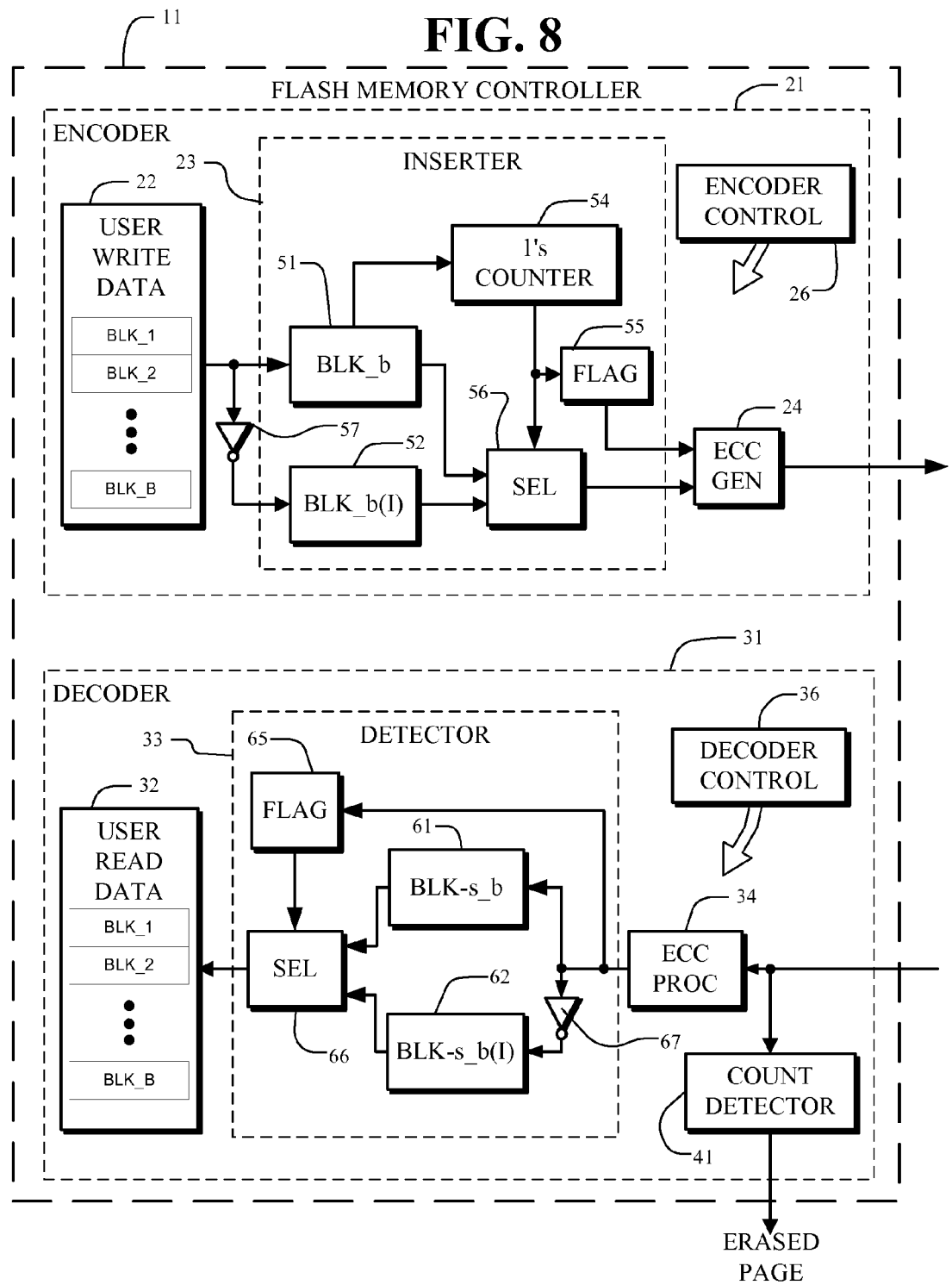
FIG. 8 depicts a block diagram of still another embodiment of the flash memory controller of FIG. 2 using the data representation of FIG. 7.

FIG. 8 depicts a block diagram of still another embodiment of the flash memory controller 11 of FIG. 1 and FIG. 2. The memory controller 11 operates for controlling writing user write data to and reading user read data from the flash memory 10 of FIG. 1 and FIG. 2.

In FIG. 8, the memory controller 11 includes an encoder 21 for encoding user write data in registers 22 for storage of code values as stored values in the memory 10 of FIG. 1 and FIG. 2. The encoder 21 includes user write data registers 22 for storing blocks of write data. The user write data has a plurality of first blocks, including blocks BLK_1, BLK_2, . . . , BLK_b, . . . , BLK_B. The encoder 21 includes an indicator inserter 23 for insertion of an indicator for indicating that one or more of the code values to be stored into the memory 10 are not erased values. In the FIG. 8 embodiment, the indicator inserter 23 includes a BLK_b register 51 for receiving each of the blocks BLK_1, BLK_2, . . . , BLK_b, . . . , BLK_B where BLK_b represents each of the blocks for b=1,2, . . . , B. The indicator inserter 23 includes a register 52 for receiving each of the blocks BLK_1, BLK_2, . . . , BLK_b, . . . , BLK_B as inverted in inverter 57 to form corresponding inverted second blocks BLK_1(I), BLK_2(I), . . . , BLK_b(I), . . . , BLK_B(I) where corresponding inverted second block BLK_b(I) represents each of the inverted second blocks for b=1, 2, . . . , B. A selector 56 selects one or the other of the blocks from the registers 51 and 52 depending on the number of 1's in the block BLK_b. If the block BLK_b contains more 0's than 1's, then the inverted second block BLK_b(I) is the selected block and a flag is inserted in flag register 55 to indicate that the corresponding second block was selected. The flag register 55 includes B locations, one for each of the B blocks BLK_1, BLK_2, . . . , $_{BLK}$_b, . . . , BLK_B. The blocks to be stored as selected by the selector 56 are the blocks BLK-s_1, BLK-s_2, . . . , BLK-s_b, . . . , BLK-s_B where BLK-s_b represents each of the stored blocks for b=1, 2, . . . , B. The encoder 21 includes an error correction code generator 24 for generating an error correction code for the blocks to be stored together with the B bits of the flag register 55.

In one typical example, the code value produced by encoder 21 is a BCH code The code value from encoder 21 is stored in the flash memory 10 of FIG. 1 and FIG. 2 as stored values.

The memory controller 11 includes a decoder 31 for decoding the stored values from the memory 11 to form user read data values. The decoder 31 includes an ECC processor 34 for processing the stored values from the flash memory 10.

The decoder 31 includes an indicator detector 33 for detecting an indicator that indicates that the decoded value is a valid code value and not an erased value. The indicator detector 33 includes a BLK-s_b register 61 for receiving each of the stored blocks BLK-s_1, BLK-s_2, . . . , BLK-s_b, . . . , BLK-s_B as received blocks and a register 62 for receiving each of the stored blocks BLK-s_1, BLK-s_2, . . . , BLK-s_b, . . . , BLK-s_B as inverted in inverter 67 to form inverted stored blocks BLK-s_1(I), BLK-s_2(I), . . . , BLK-s_b(I), . . . , BLK-s_B(I) where BLK-s_b(I) represents each of the inverted stored blocks for b=1, 2, . . . , B. A selector 66 selects one or the other of the blocks from the registers 61 and 62 depending on the corresponding value in the flag register 65. The flag register 65 includes B locations, one for each of the B blocks BLK-s_1, BLK-s_2, . . . , BLK-s_b, . . . , BLK-s_B. The B blocks from selector 66 are stored into the user read data registers 32 as blocks BLK_1, BLK_2, . . . , BLK_b, . . . , BLK_B. In operation, the selector 66 selects received stored blocks or inverted stored blocks where one of the received stored blocks is selected when a corresponding one of the flags is not set and the corresponding one of the inverted stored blocks is selected when the corresponding one of the stored flags is set.

In FIG. 8, count detector 41 determines, if the number of 1's in the stored values read from memory is less than a threshold, that the stored values are erased data. The count detector 41 counts the number of 1's in the data read from the flash memory 10. If the number of 1's is less than T, where T is a threshold equal to the correction power of the code, the read data from the flash memory 10 is determined to be erased data. If the number of 1's is greater than or equal to T, then the read data from the flash memory 10 is determined to be not erased data.

The processor 1 of FIG. 1 commands the flash memory controller 11 of FIG. 8 to control the memory 10 of FIG. 1 and FIG. 2 to write code values into the memory 10 as stored values and to read stored values from the memory 10. The processor 1 of FIG. 1 erases blocks in the memory 10 to all 1's by storing erased values in the memory cells a block of memory cells at a time.

In connection with the operation of FIG. 8, a page or block in the memory 10 is physically erased to all 1's. In one example, BCH15 code words may have any length of all 0's (up to the code limit of $2^{15}$ 0's). In connection with the FIG. 8 embodiment, however, any block having more 0's than 1's is inverted. Accordingly, in the FIG. 8 operation, any string of all 0's for the blocks BLK_1, BLK_2, . . . , BLK_b, . . . , BLK_B, is inverted to all 1's in the indicator inserter 23 for storage as stored values in the flash memory 10. In this manner, the all 0's code word from controller 11 is not readily distinguished from the all 1's erased values.

In FIG. 8, count detector 41 counts the number of 1's. If the number of 1's is less than $T_1$, where $T_1$ is a threshold such that the read data from the flash memory is guaranteed to be erased data. If the number of 1's is greater than or equal to $T_1$, then the read data from the flash memory is guaranteed to be a code word. The threshold $T_1$ of count detector 41 in FIG. 8 is much larger than T, where T is the correction power of the code. In one example, $T_1$ is about half of the number of user data bits, that is, $T_1$=N/2.

Figure 9:
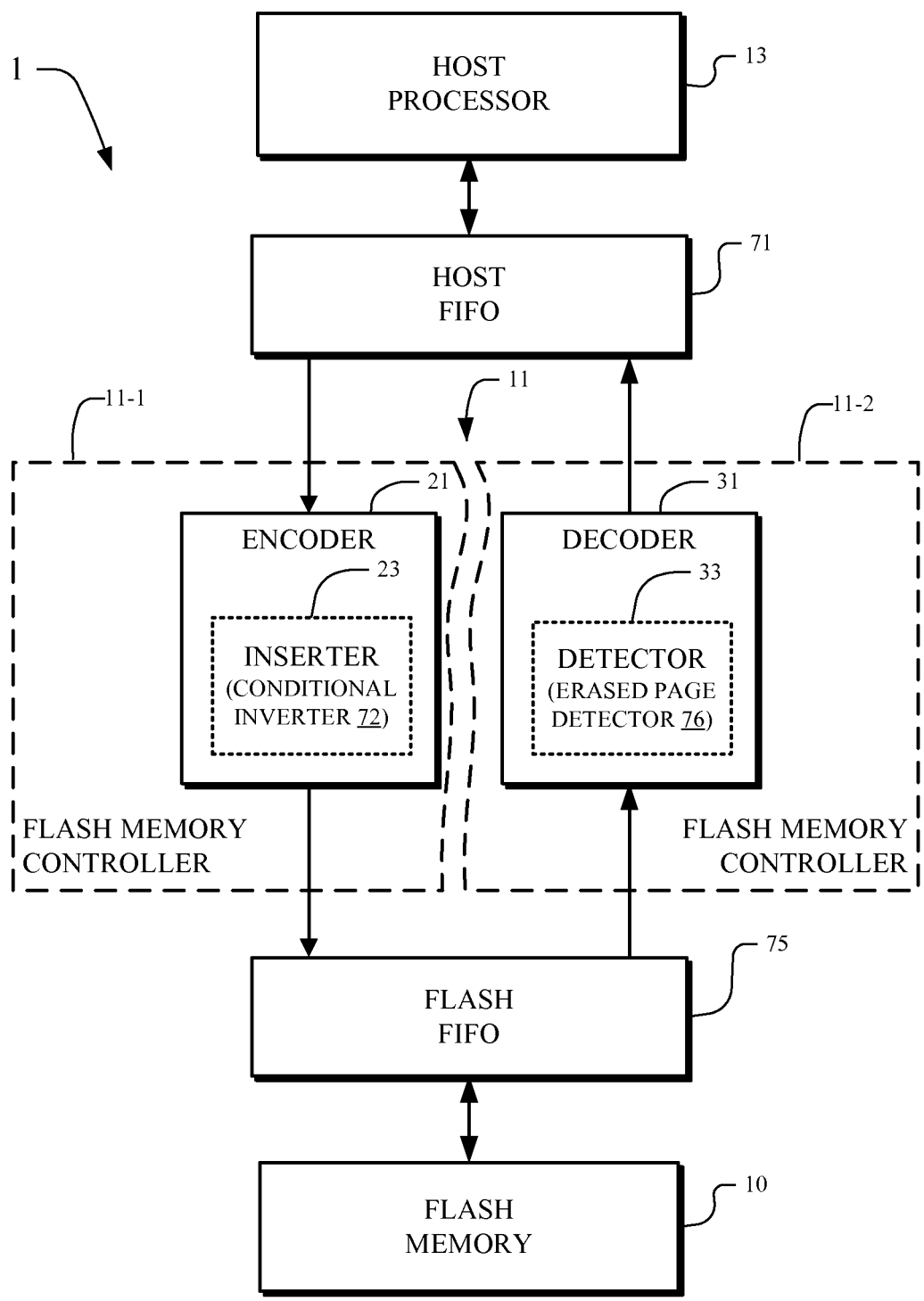
FIG. 9 depicts a block diagram of another embodiment of the flash memory system of FIG. 1 including a flash memory controller with an encoder for encoding data for storing in a flash memory and a decoder for decoding data from a flash memory.

FIG. 9 depicts a block diagram of another embodiment of the flash memory system 1 of FIG. 1 including a flash memory controller 11 including controller part 11-1 and controller part 11-2. Controller part 11-1 includes encoder 21 for encoding data for storing stored values in the flash memory 10. The encoder 21 includes an inserter 23 for insertion of an indicator as part of the stored values. The inserter 23 includes a conditional inverter 72 for conditionally inverting data to be stored into the flash memory 10 as stored values. Controller part 11-2 includes decoder 31 for decoding data from the flash memory 10 for use by the host processor 13. The decoder 31 includes a detector 33 which is, for example, an erased page detector 76 for detecting when the data retrieved from the flash memory 10 is an erased page. The host processor 13 exchanges information with the flash memory controller 11 through the bidirectional host FIFO (First-In-First-Out) queue 71. The flash memory 10 exchanges information with the flash memory controller 11 through the bidirectional host FIFO queue 75.

Figure 10:
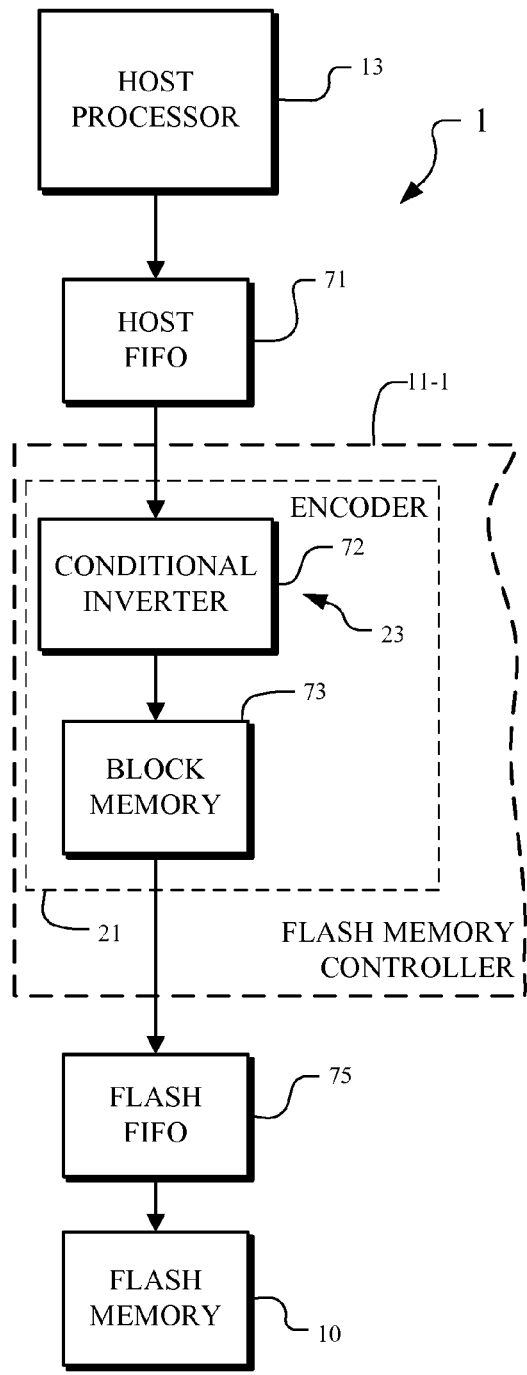
FIG. 10 depicts a block diagram of the encoder portion of the flash memory system of FIG. 9 including a conditional inverter.

FIG. 10 depicts a block diagram of further details the flash memory system 1 of FIG. 9 including controller part 11-1 of flash memory controller 11. The controller part 11-1 includes encoder 21 for encoding data for storing in the flash memory 10. The encoder 21 includes a conditional inverter 72 for conditionally inverting data to be stored into the flash memory 10. The conditional inverter 72 connects the conditionally inverted data to the block memory 73 for encoding. An output from the block memory 73 is input to the bidirectional flash FIFO queue 75 for storage in the flash memory 10.

Figure 11:
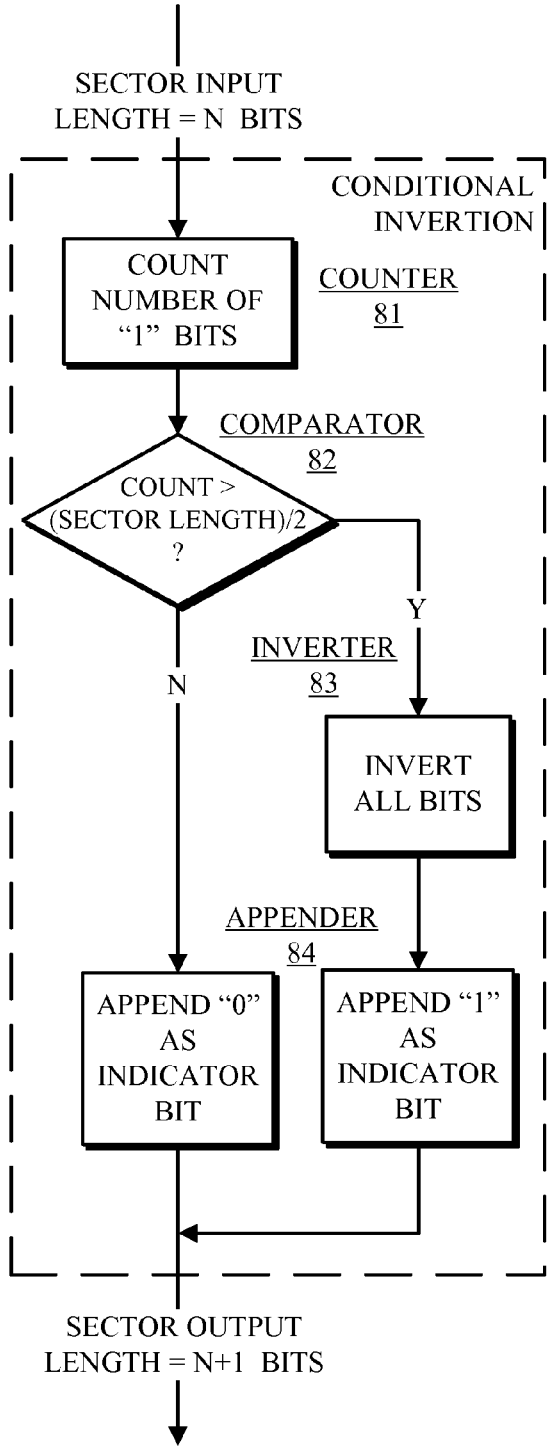
FIG. 11 depicts a block diagram of the conditional inversion processing in the conditional inverter in the flash memory controller of the flash memory system of FIG. 10.

FIG. 11 depicts a block diagram of the conditional inversion processing in the conditional inverter 72 in the flash memory controller part 11-1 of the flash memory system 1 of FIG. 10. The input to the conditional inverter 72 of FIG. 10 is shown in FIG. 11 as having a SECTOR INPUT LENGTH=N BITS. The conditional inverter 72 operates to COUNT THE NUMBER OF "1" BITS in a counter 81. Next, the test "COUNT>(SECTOR LENGTH)/2?" is made in a comparator 82.

Referring to FIG. 11, if as a result of the test, the count is greater than (SECTOR LENGTH)/2, the yes, Y, output is active and if not, the no, N, output is active. The yes, Y, output causes the conditional inverter to perform the INVERT ALL BITS operation in an inverter 83 and causes the APPEND "1" AS INDICATOR BIT operation in appender 84. The inverted bits with the appended "1" provide the output from the conditional inverter 72 of FIG. 10 with the SECTOR OUTPUT LENGTH=N+1 BITS. The no, N, occurs when the count is not greater than (SECTOR LENGTH)/2 and hence does not satisfy the invert condition so that the APPEND "0" AS INDICATOR BIT operation occurs in appender 84. The non-inverted bits with the appended "0" provide the output from the conditional inverter 72 of FIG. 10 with the SECTOR OUTPUT LENGTH=N+1 BITS.

The operation of the memory system 1 of FIG. 10 with the conditional inversion as described in connection with FIG. 11 is described in connection with TABLE 18, TABLE 19 and TABLE 20. In the examples, a sector equals a page and the page (and sector) length is N bits. In TABLE 18, TABLE 19 and TABLE 20 user data is given for four examples. In the first example, the page is ALL 1's. In the second example, the page is ALL 0's. In the third example, the page has one more than half 1's, that is, the page is (HALF+1) 1's. In the fourth example, the page has an equal number of 1's and 0's, that is, the page is HALF-HALF.

The user data input to the conditional inverter 72 is indicated in the following TABLE 18:

TABLE 18

| ALL 1's | ALL 0's | (HALF + 1) 1's | HALF-HALF |
|---|---|---|---|
| 11...1111 | 00...0000 | 1...1100... | 0...0011...1 |

The conditional inverter 72 processes the TABLE 18 data to produce the data indicated in TABLE 19.

TABLE 19

| ALL 1's | ALL 0's | (HALF + 1) 1's | HALF-HALF |
|---|---|---|---|
| 00...0000  1 | 00...0000  0 | 0...1100...  1 | 0...0011...1 0 |

In TABLE 18, the ALL 1's page data has the test "COUNT>(SECTOR LENGTH)/2 ?" satisfied as a yes, Y, and therefore all the bits are inverted to 0's and the indicator bit is inserted as a "1". The ALL 0's page data has the test "COUNT>(SECTOR LENGTH)/2?" not satisfied as a no, N, and therefore all the bits are not inverted and remain 0's and the indicator bit is inserted as a "0". The (HALF+1) 1's page data has the test "COUNT>(SECTOR LENGTH)/2?" satisfied as a yes, Y, and therefore all the bits are inverted and the indicator bit is inserted as a "1". The HALF-HALF page data has the test "COUNT>(SECTOR LENGTH)/2?" not satisfied as a no, N, and therefore all the bits are not inverted and the indicator bit is inserted as a "0".

The conditionally inverted page data of TABLE 19 is stored in the flash memory as shown in the following TABLE 20:

TABLE 20

| ALL 1's | ALL 0's | (HALF + 1) 1's | HALF-HALF |
|---|---|---|---|
| 00...0000  1 | 00...0000  0 | 0...1100...  1 | 0...0011...1 0 |

Figure 12:
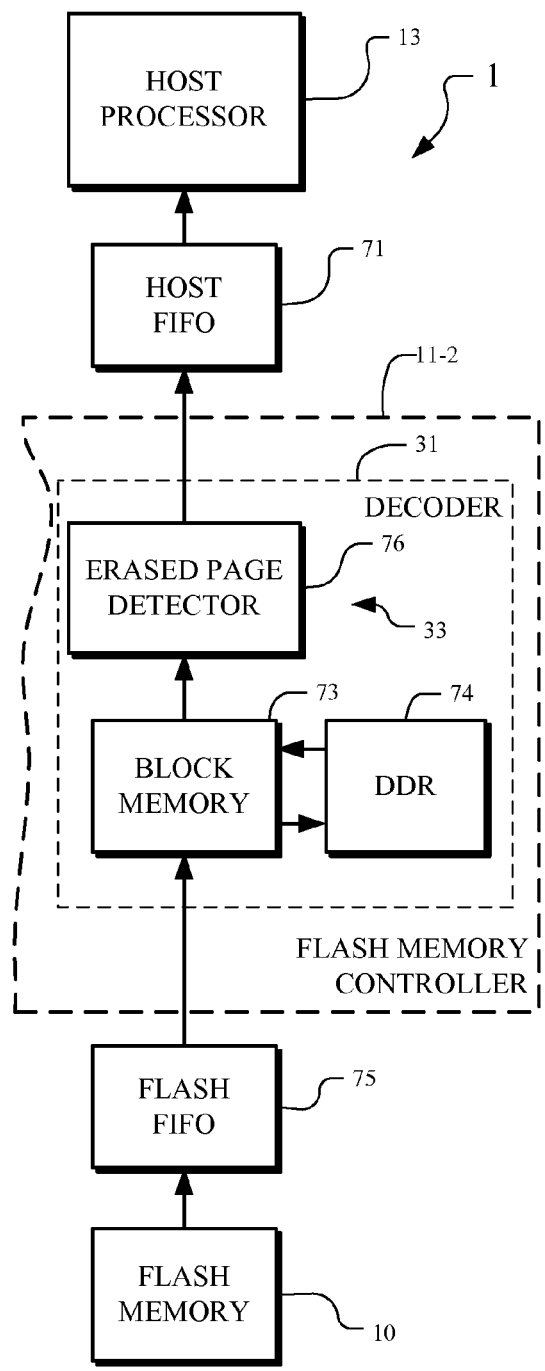
FIG. 12 depicts a block diagram of the decoder portion of the flash memory system of FIG. 9 including an erased page detector.

FIG. 12 depicts a block diagram of further details the flash memory system 1 of FIG. 9 including controller part 11-2 of flash memory controller 11. The controller part 11-2 includes decoder 31 for decoding data from the flash memory 10. The data from the flash memory 10 is input, through flash FIFO 75, to the block memory 73 for decoding in cooperation with the DDR 74. The decoder 31 includes the erased page detector 76 for detecting whether the decoded data retrieved from the flash memory 10 is an erased page. An output from the erased page detector 76 and the block memory 73 is input to the bidirectional flash FIFO queue 71 for transfer to the host processor 13.

Figure 13:
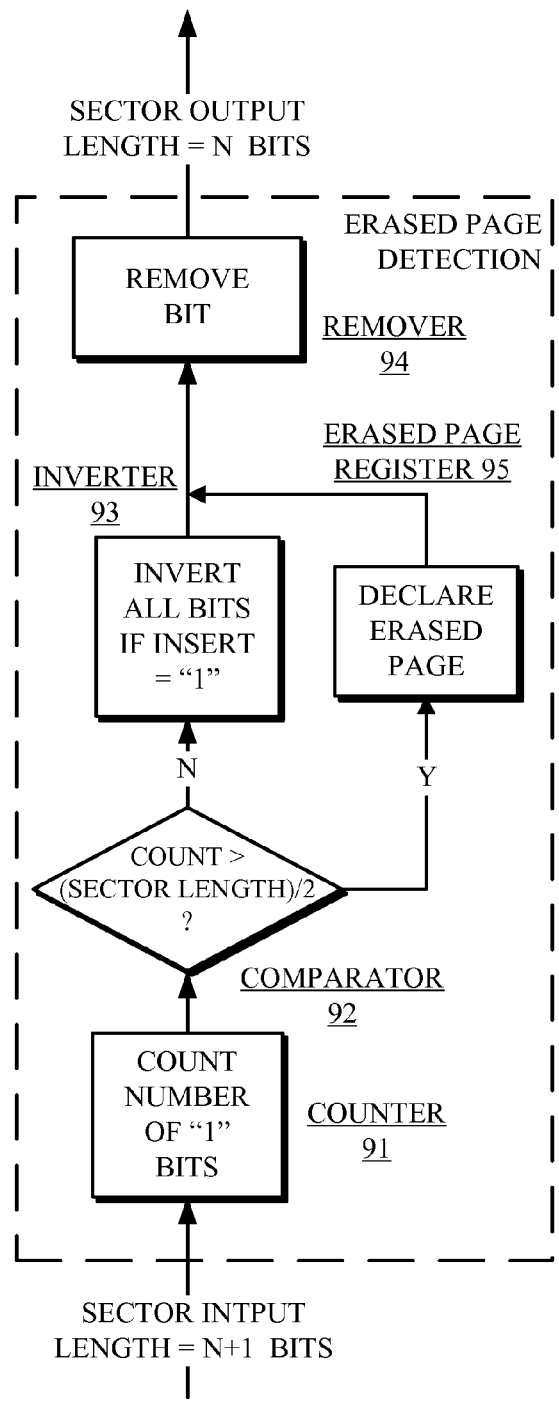
FIG. 13 depicts a block diagram of the erased page detection processing in the erased page detector in the flash memory controller of the flash memory system of FIG. 12.

FIG. 13 depicts a block diagram of the erased page detection processing in the erased page detector 76 in the decoder 31 in flash memory controller part 11-2 of the flash memory system 1 of FIG. 12. The memory data input to the erased page detector 76 of FIG. 12 is shown in FIG. 11 as having the SECTOR INPUT LENGTH=N+1 BITS. The input is processed by the COUNT THE NUMBER OF "1" BITS operation in counter 91. Next, the test "COUNT>(SECTOR LENGTH)/2?" is made in comparator 92.

Referring to FIG. 13, if the count as a result of the test is greater than (SECTOR LENGTH)/2, the yes, Y, output is active and if not, the no, N, output is active. The yes, Y, output signifies an erased page and the DECLARE ERASED PAGE operation occurs and is stored in erased page register 95. The erased declaration causes the REMOVE INDICATOR BIT operation to be performed IN REMOVER 94 and the decoded data from the flash memory 10 is transferred to the host FIFO 71 without inversion and with the SECTOR OUTPUT LENGTH=N BITS. The no, N, output signifies that an inversion is required causing the INVERT ALL BITS operation in inverter 93 to be performed and the decoded data from the flash memory 10 is transferred to the host FIFO 71 with inversion in inverter 93 and with the SECTOR OUTPUT LENGTH=N BITS after the REMOVE INDICATOR BIT operation is performed in remover 94.

The operation of the memory system 1 of FIG. 12, with the erased page detection as described in connection with FIG. 13, is described in connection with TABLE 21, TABLE 22 and TABLE 23. In the examples, a sector equals a page and the page (and sector) length is N bits. In TABLE 21, TABLE 22 and TABLE 23, user data as stored in the flash memory 10 is given for the same four examples as described in connection with TABLE 18, TABLE 19 and TABLE 20. Additionally, TABLE 21, TABLE 22 and TABLE 23 also indicate operation when a page of data in memory 10 is an ERASED PAGE with the page in the all 1's ERASED STATE.

In TABLE 22, the page data retrieved from the flash memory 10 is the same data as stored as described in connection with TABLE 20 with the addition of the all 1's ERASED PAGE example.

TABLE 21

| ALL 1's | ALL 0's | (HALF + 1) 1's | HALF-HALF | ERASED PAGE |
|---|---|---|---|---|
| 00...0000  1 | 00...0000  0 | 0...1100...  1 | 0...0011...1 0 | ...1111...  0 |

In TABLE 22, the page data retrieved from the flash memory 10 by the flash memory controller part 11-2 is the same data as stored as described in connection with FIG. 20 with the addition of the all 1's ERASED PAGE example.

TABLE 22

| ALL 1's | ALL 0's | (HALF + 1) 1's | HALF-HALF | ERASED PAGE |
|---|---|---|---|---|
| 00...0000 1 | 00...0000 0 | 0...1100... 1 | 0...0011...1 0 | ...1111... 0 |

In connection with the data of TABLE 22, the erased page detection processing of FIG. 13 is performed. For each of the examples of TABLE 22, the SECTOR INPUT LENGTH=N+1 BITS. For each of the examples of TABLE 22, the input is processed by the COUNT THE NUMBER OF "1" BITS operation. Next, the test "COUNT>(SECTOR LENGTH)/2?" is made.

For the ALL 1's example, the "COUNT>(SECTOR LENGTH)/2?" result is no, N, and the INDICATOR BIT=1 so the all 0's are inverted to all 1's. The REMOVE INDICATOR BIT leaves all 1's, with the SECTOR OUTPUT LENGTH=N BITS, stored into the host FIFO 71 of FIG. 12.

For the ALL 0's example, the "COUNT>(SECTOR LENGTH)/2?" result is no, N, and the INDICATOR BIT=0 so the all 0's are not inverted. The REMOVE INDICATOR BIT leaves all 0's, with the SECTOR OUTPUT LENGTH=N BITS, stored into the host FIFO 71 of FIG. 12.

For the (HALF+1) 1's example, the "COUNT>(SECTOR LENGTH)/2?" result is no, N, and the INDICATOR BIT=0 so the data values are not inverted. The REMOVE INDICATOR BIT leaves the not inverted data bits, with the SECTOR OUTPUT LENGTH=N BITS, stored into the host FIFO 71 of FIG. 12.

For the HALF-HALF example, the "COUNT>(SECTOR LENGTH)/2?" result is no, N, and the INDICATOR BIT=1 so the data values are inverted. The REMOVE INDICATOR BIT leaves the inverted data bits, with the SECTOR OUTPUT LENGTH=N BITS, stored into the host FIFO 71 of FIG. 12.

For the ERASED PAGE example, the "COUNT>(SECTOR LENGTH)/2?" result is yes, Y, and the DECLARE ERASED PAGE is indicated and stored into the host FIFO 71 of FIG. 12.

In TABLE 23, the page data in host processor 13 from host FIFO 71 is the same as the data in TABLE 18 as it existed at the beginning of the examples described. The ERASED PAGE indication distinguishes the all 1's ERASED STATE from the all 1's of the ALL 1's example.

TABLE 23

| ALL 1's | ALL 0's | (HALF + 1) 1's | HALF-HALF | ERASED PAGE |
|---|---|---|---|---|
| 11...1111 | 00...0000 | 1...1111... | 0...0011...1 | DETECTED |

The embodiments described in connection with FIG. 9 through FIG. 13 have efficient Erased Page Detection of erased pages in the flash memory 10 that relies on the data content of the flash memory 10 using an efficient flash memory controller 11. The Erased Page Detection requires only a small expansion of the data page size and provides a large Hamming Distance between a user data page and an erased page in the flash memory 10. In embodiments of the present specification, the data page expansion is as small as 1 bit and the Hamming Distance is "(Page Length in bits)/2". To achieve these goals, embodiments in the present specification uses a reduced number of '1' bits for storage in the flash memory 10.

The Erase Page Detection operation relies upon a Conditional Insertion. The Conditional Insertion examines an input page. If the number of '1' bits is greater than [Page Length in bits]/2, the Conditional Insertion inverts all the bits of the page, that is, 1's are inverted to 0's and 0's are inverted to 1's. For example, if a page has N '1' bits and N>[Page Length in bits]/2, the inversion will change N into [Page Length in bits]−N. If N≤[Page Length in bits]/2, inversion does not happen. The Conditional Insertion attaches (inserts) an Indicator at the beginning of the page. The Indicator will be one logical state, for example '1' if inversion has happened, and another logical state, for example '0', otherwise. In an example where User Data Pages are conditionally inverted, Erased Page Detection is carried out by counting with a threshold of [Page Length in bits]/2.

While the invention has been particularly shown and described with reference to preferred embodiments thereof it will be understood by those skilled in the art that various changes in form and details typically is made therein without departing from the scope of the invention.

What is claimed is:

1. A memory device comprising:
   a memory; and
   a memory controller comprising an encoder, wherein the encoder is configured to receive first data to be written to the memory,
      generate a first set of cyclic redundancy codes corresponding to the first data,
      determine whether the first data is valid data,
      in response to determining that the first data is valid data,
         (i) modify the first set of cyclic redundancy codes to generate a second set of cyclic redundancy codes, and
         (ii) append the second set of cyclic redundancy codes to the first data to generate modified data, and
      in response to determining that the first data represents erased data, append the first set of cyclic redundancy codes to the first data to generate the modified data,
   wherein the memory controller is configured to write, to the memory, the modified data.

2. The memory device of claim 1, wherein the encoder is further configured to:
   in response to determining that the first data is not valid data, append the first set of cyclic redundancy codes to the first data to generate the modified data.

3. The memory device of claim 1, wherein the encoder is configured to modify the first set of cyclic redundancy codes to generate the second set of cyclic redundancy codes by:
   inverting one or more bits of the first set of cyclic redundancy codes to generate the second set of cyclic redundancy codes.

4. The memory device of claim 1, wherein the memory controller is further configured to encode the modified data, prior to writing the modified data to the memory.

5. The memory device of claim 4, wherein the memory controller is further configured to invert the encoded modified data, prior to writing the encoded modified data to the memory.

6. The memory device of claim 1, wherein the memory controller further comprises a decoder configured to:
   read the modified data from the memory;
   evaluate the modified data that is read from the memory, to determine if the modified data comprises valid data; and
   in response to determining that the modified data comprises valid data, generate user data from the modified data read from the memory.

7. A memory device comprising:
   a memory; and
   a memory controller comprising an encoder, wherein the encoder is configured to receive first data to be written to the memory,
      generate a first set of cyclic redundancy codes corresponding to the first data,
      determine whether the first data is valid data,
      in response to determining that the first data is valid data,
         (i) modify the first set of cyclic redundancy codes to generate a second set of cyclic redundancy codes, and
         (ii) append the second set of cyclic redundancy codes to the first data to generate modified data,
   wherein the memory controller is configured to write, to the memory, the modified data,
   wherein the memory controller further comprises a decoder configured to
      read the modified data from the memory,
      evaluate the modified data that is read from the memory, to determine if the modified data comprises valid data, and
      in response to determining that the modified data comprises valid data, generate user data from the modified data read from the memory,
   wherein the decoder is configured to evaluate the modified data that is read from the memory by
      counting a number of 1's in the modified data read from the memory, and
      if the number of 1's counted is greater than a threshold, determining that the modified data comprises valid data.

8. The memory device of claim 7, wherein:
   the modified data is encoded, prior to writing the modified data to the memory;
   the modified data has code values comprising a correction power of T; and
   the threshold is equal to T.

9. A memory device comprising:
   a memory; and
   a memory controller comprising an encoder, wherein the encoder is configured to receive first data to be written to the memory,
      generate a first set of cyclic redundancy codes corresponding to the first data,
      determine whether the first data is valid data,
      in response to determining that the first data is valid data,
         (i) modify the first set of cyclic redundancy codes to generate a second set of cyclic redundancy codes, and
         (ii) append the second set of cyclic redundancy codes to the first data to generate modified data,
   wherein the memory controller is configured to write, to the memory, the modified data,
   wherein the memory controller further comprises a decoder configured to read the modified data from the memory,
      evaluate the modified data that is read from the memory, to determine if the modified data comprises valid data, and
      in response to determining that the modified data comprises valid data, generate user data from the modified data read from the memory,
   wherein the decoder is configured to evaluate the modified data that is read from the memory by
      identifying cyclic redundancy codes in the modified data read from the memory;
      counting a number of 1's in the identified cyclic redundancy codes; and
      if the number of 1's counted is greater than a threshold, determining that the modified data comprises valid data.

10. A memory device comprising:
    a memory; and
    a memory controller comprising an encoder, wherein the encoder is configured to receive first data to be written to the memory,
       generate a first set of cyclic redundancy codes corresponding to the first data,
       determine whether the first data is valid data,
       in response to determining that the first data is valid data,
          (i) modify the first set of cyclic redundancy codes to generate a second set of cyclic redundancy codes, and
          (ii) append the second set of cyclic redundancy codes to the first data to generate modified data,
    wherein the memory controller is configured to write, to the memory, the modified data,
    wherein the memory controller further comprises a decoder configured to read the modified data from the memory,
       evaluate the modified data that is read from the memory, to determine if the modified data comprises valid data, and
       in response to determining that the modified data comprises valid data, generate user data from the modified data read from the memory,
    wherein the decoder is configured to generate the user data from the modified data read from the memory by
       in response to determining that the modified data comprises valid data,
          (i) identifying the second set of cyclic redundancy codes in the modified data read from the memory,
          (ii) modifying the second set of cyclic redundancy codes in the modified data read from the memory to generate the first set of cyclic redundancy codes, and
          (iii) using the generated first set of cyclic redundancy codes to generate the user data from the modified data read from the memory.

11. A method comprising:
    receiving first data to be written to a memory;
    generating a first set of cyclic redundancy codes corresponding to the first data;
    determining whether the first data is valid data;
    in response to determining that the first data is valid data,
       (i) modifying the first set of cyclic redundancy codes to generate a second set of cyclic redundancy codes, and
       (ii) appending the second set of cyclic redundancy codes to the first data to generate modified data;

in response to determining that the first data represents erased data, appending the first set of cyclic redundancy codes to the first data to generate the modified data; and writing, to the memory, the modified data.

12. The method of claim 11, further comprising:
in response to determining that the first data is not valid data, appending the first set of cyclic redundancy codes to the first data to generate the modified data.

13. The method of claim 11, wherein modifying the first set of cyclic redundancy codes to generate the second set of cyclic redundancy codes comprises:
inverting one or more bits of the first set of cyclic redundancy codes to generate the second set of cyclic redundancy codes.

14. The method of claim 11, further comprising:
encoding the modified data, prior to writing the modified data to the memory.

15. The method of claim 14, further comprising:
inverting the encoded modified data, prior to writing the encoded modified data to the memory.

16. The method of claim 11, further comprising:
reading the modified data from the memory;
evaluating the modified data that is read from the memory, to determine if the modified data comprises valid data; and
in response to determining that the modified data comprises valid data, generating user data from the modified data read from the memory.

17. A method comprising:
receiving first data to be written to a memory;
generating a first set of cyclic redundancy codes corresponding to the first data;
determining whether the first data is valid data;
in response to determining that the first data is valid data,
    (i) modifying the first set of cyclic redundancy codes to generate a second set of cyclic redundancy codes, and
    (ii) appending the second set of cyclic redundancy codes to the first data to generate modified data;
writing, to the memory, the modified data;
reading the modified data from the memory;
evaluating the modified data that is read from the memory, to determine if the modified data comprises valid data; and
in response to determining that the modified data comprises valid data, generating user data from the modified data read from the memory,
wherein evaluating the modified data that is read from the memory comprises
    counting a number of 1's in the modified data read from the memory, and
    if the number of 1's counted is greater than a threshold, determining that the modified data comprises valid data.

18. The method of claim 17, wherein:
the modified data is encoded, prior to writing the modified data to the memory;
the modified data has code values comprising a correction power of T; and
the threshold is equal to T.

19. A method comprising:
receiving first data to be written to a memory;
generating a first set of cyclic redundancy codes corresponding to the first data;
determining whether the first data is valid data;
in response to determining that the first data is valid data,
    (i) modifying the first set of cyclic redundancy codes to generate a second set of cyclic redundancy codes, and
    (ii) appending the second set of cyclic redundancy codes to the first data to generate modified data;
writing, to the memory, the modified data;
reading the modified data from the memory;
evaluating the modified data that is read from the memory, to determine if the modified data comprises valid data; and
in response to determining that the modified data comprises valid data, generating user data from the modified data read from the memory,
wherein evaluating the modified data that is read from the memory comprises
    identifying cyclic redundancy codes in the modified data read from the memory,
    counting a number of 1's in the identified cyclic redundancy codes, and
    if the number of 1's counted is greater than a threshold, determining that the modified data comprises valid data.

20. A method comprising:
receiving first data to be written to a memory;
generating a first set of cyclic redundancy codes corresponding to the first data;
determining whether the first data is valid data;
in response to determining that the first data is valid data,
    (i) modifying the first set of cyclic redundancy codes to generate a second set of cyclic redundancy codes, and
    (ii) appending the second set of cyclic redundancy codes to the first data to generate modified data;
writing, to the memory, the modified data;
reading the modified data from the memory;
evaluating the modified data that is read from the memory, to determine if the modified data comprises valid data; and
in response to determining that the modified data comprises valid data, generating user data from the modified data read from the memory,
wherein generating the user data from the modified data read from the memory comprises
    in response to determining that the modified data comprises valid data,
        (i) identifying the second set of cyclic redundancy codes in the modified data read from the memory,
        (ii) modifying the second set of cyclic redundancy codes in the modified data read from the memory to generate the first set of cyclic redundancy codes, and
        (iii) using the generated first set of cyclic redundancy codes to generate the user data from the modified data read from the memory.

* * * * *